(12) United States Patent
Kucherov et al.

(10) Patent No.: US 6,489,704 B1
(45) Date of Patent: Dec. 3, 2002

(54) HYBRID THERMIONIC ENERGY CONVERTER AND METHOD

(75) Inventors: Yan R. Kucherov, Salt Lake City, UT (US); Peter L. Hagelstein, Framingham, MA (US)

(73) Assignee: Eneco, Inc., Salt Lake City, UT (US)

( * ) Notice: Subject to any disclaimer, the term of this patent is extended or adjusted under 35 U.S.C. 154(b) by 0 days.

(21) Appl. No.: 09/519,640

(22) Filed: Mar. 6, 2000

Related U.S. Application Data

(60) Provisional application No. 60/123,900, filed on Mar. 11, 1999.

(51) Int. Cl.[7] ................................................. H02N 3/00
(52) U.S. Cl. .................................................. 310/306
(58) Field of Search ................................. 310/306–309

(56) References Cited

U.S. PATENT DOCUMENTS

| | | | |
|---|---|---|---|
| 3,173,032 A | 3/1965 | Maynard | 310/4 |
| 3,267,308 A | * 8/1966 | Hernqvist | 310/306 |
| 3,328,611 A | 6/1967 | Davis | 310/4 |
| 3,515,908 A | 6/1970 | Caldwell | 310/4 |
| 3,843,986 A | 10/1974 | Rason et al. | 310/4 |
| 3,890,161 A | 6/1975 | Brown, III | 136/212 |
| 3,899,696 A | 8/1975 | Fletcher et al. | |
| 3,983,423 A | 9/1976 | Rasor et al. | 310/4 |
| 4,040,903 A | 8/1977 | Monroe, Jr. | 176/39 |
| 4,047,093 A | 9/1977 | Levoy | 322/2 |
| 4,151,438 A | 4/1979 | Fitzpatrick et al. | 310/306 |
| 4,188,571 A | 2/1980 | Brunson | 322/2 |
| 4,266,179 A | 5/1981 | Hamm, Jr. | 322/2 |
| 4,280,074 A | 7/1981 | Bell | 310/306 |
| 4,281,280 A | 7/1981 | Richards | 322/2 |
| 4,298,768 A | 11/1981 | Israel et al. | 136/253 |
| 4,303,845 A | 12/1981 | Davis | 310/306 |
| 4,323,808 A | 4/1982 | Davis | 310/306 |
| 4,346,330 A | 8/1982 | Lee et al. | 315/150 |

(List continued on next page.)

FOREIGN PATENT DOCUMENTS

EP 0 452 661 A2 10/1991

OTHER PUBLICATIONS

D.M. Rowe, Ph.D., D.Sc., *CRC Handbook of THERMO-ELECTRICS*, CRC Press, 1995.

Bass, John C. et al., Improved Thermoelectric Converter Units and Power Generators:, *Electronics Tech Briefs*, Dec. 1999.

DiSalvo, Francis J., Thermoelectric Cooling and Power Generation:, *Science*, vol. 285 (Jul. 16, 1999), pp. 391–394.

Mahan, G.D. et al., Multilayer Thermionic Refrigerator and Generator:, *Journal of Applied Physics*, vol. 83, No. 9 (1 Ma 1998) pp. 4683–4689.

(List continued on next page.)

Primary Examiner—Mark O. Budd
(74) Attorney, Agent, or Firm—Workman, Nydegger & Seeley

(57) ABSTRACT

The present invention embodies a solid state thermionic energy converter and is directed to a method and apparatus for conversion of thermal energy to electrical energy, and electrical energy to refrigeration. The present invention maintains a thermal separation between an emitter and a collector through a fractional surface contact of decreasing cross-sectional area towards the point of contact. The fractional surface contacts may be associated with the emitter, a barrier, or the collector. Maintaining a thermal separation between the emitter and the collector provides for ballistic electron transport through the barrier and reduces the transport of electrons through thermal conductivity. Hence, the efficiency is increased through the collection of ballistic electrons and the reduction of thermal conductivity electrons which cannot be collected. The inventive principle works for hole conductivity, as well as for electrons. It is emphasized that this abstract is provided to comply with the rules requiring an abstract which will allow a searcher or other reader to quickly ascertain the subject matter of the technical disclosure. It is submitted with the understanding that it will not be used to interpret or limit the scope or meaning of the claims.

64 Claims, 13 Drawing Sheets

U.S. PATENT DOCUMENTS

| | | | | |
|---|---|---|---|---|
| 4,368,416 A | | 1/1983 | James | 322/2 |
| 4,373,142 A | | 2/1983 | Morris | 310/306 |
| 4,528,417 A | | 7/1985 | Chubb | 136/253 |
| 4,667,126 A | | 5/1987 | Fitzpatrick | |
| 4,700,099 A | | 10/1987 | Iden | 310/306 |
| 4,755,350 A | | 7/1988 | Kennel | 376/321 |
| 4,771,201 A | | 9/1988 | Free | 310/306 |
| 4,927,599 A | | 5/1990 | Allen | 376/321 |
| 5,028,835 A | | 7/1991 | Fitzpatrick | 313/14 |
| 5,327,038 A | * | 7/1994 | Culp | 310/306 |
| 5,459,367 A | | 10/1995 | Davis | 310/306 |
| 5,492,570 A | | 2/1996 | Horner-Richardson et al. | 136/200 |
| 5,541,464 A | | 7/1996 | Johnson et al. | 310/306 |
| 5,572,042 A | | 11/1996 | Thomas et al. | 257/10 |
| 5,578,886 A | | 11/1996 | Holmlid et al. | 310/306 |
| 5,623,119 A | | 4/1997 | Yater et al. | 136/225 |
| 5,637,946 A | * | 6/1997 | Bushman | 310/306 |
| 5,646,474 A | | 7/1997 | Pryor | 313/310 |
| 5,722,242 A | | 3/1998 | Edelson | 62/3.1 |
| 5,780,954 A | | 7/1998 | Davis | 310/306 |
| 5,841,219 A | | 11/1998 | Sadwick et al. | 313/293 |
| 5,955,772 A | | 9/1999 | Shakouri et al. | 257/467 |
| 5,973,259 A | | 10/1999 | Edelson | 136/254 |
| 5,981,071 A | | 11/1999 | Cox | 428/408 |
| 5,994,638 A | | 11/1999 | Edelson | |
| 6,020,671 A | * | 2/2000 | Pento et al. | 310/306 |
| 6,037,697 A | | 3/2000 | Begg et al. | |

OTHER PUBLICATIONS

Mahan, G.D. et al., Multilayer Thermoionic Refrigeration:, *Physical Review Letters*, vol. 80, No. 18 (May 4, 1998) pp. 4016–4019.

Rasor, Ned S., "VA. Technology of Thermoelectric and Thermionic Energy Conversion", *RASOR Associates Report*, 1989 pp. 397–414.

Rasor, Ned S., VB. Engineering Aspects of Thermionic Energy Conversion:, *RASOR Associates Report*, (1989), pp. 415–443.

Lin, T.P. et al., "Thermionic Emission Including Both Space–charge and Image Forces", *Journal of Applied Physics*, vol. 85, No. 8 (Apr. 15, 1989), pp. 3205–3211.

Bates, Clayton W. Jr., "Low–temperature Thermionic Emitters Using Metal–semiconductor Composites", *Materials Letters*, vol. 23, (Apr. 1995), pp. 1–5.

Shakouri, Ali et al., "Heterostructure Integrated Thermionic Coolers", *Applied Physics Letters*, vol. 71, No. 9 (Sep. 1, 1997) pp. 1234–1236.

Mahan, G.D. et al., "Multilayer Thermionic Refrigerator and Generator", *Journal of Applied Physics*, vol. 83, No. 9 (May 1, 1998) pp. 4683–4689.

Collier, C.P. et al., "Electronically Configurable Molecular–Based Logic Gates", *Science*, vol. 285 (Jul. 16, 1999), pp. 391–394.

* cited by examiner

HYBRID THERMIONIC ENERGY CONVERTER AND METHOD

CROSS-REFERENCE TO RELATED APPLICATIONS

This application claims priority to copending Provisional Application No. 60/123,900, filed on Mar. 11, 1999, entitled "Solid State Thermionic Energy Converter and Method," and naming Yan R. Kucherov and Peter L. Hagelstein as the inventors.

FIELD OF THE INVENTION

This invention relates to the conversion of thermal energy to electrical energy, and electrical energy to refrigeration, and more particularly to a thermionic converter of improved efficiency and power densities, which utilizes electron tunneling and thermionic emission facilitated by the reduction in the barrier height from image force effects.

BACKGROUND OF THE INVENTION

The present invention was developed to fill a need for a device which efficiently converts thermal energy to electrical energy at relatively low operating temperatures and with power densities large enough for commercial applications. The present invention also operates in reverse mode to provide efficient cooling.

Thermionic energy conversion is a method of converting heat energy directly into electrical energy by thermionic emission. In this process, electrons are thermionically emitted from the surface of a metal by heating the metal and imparting sufficient energy to a portion of the electrons to overcome retarding forces at the surface of the metal in order to escape. Unlike most other conventional methods of generating electrical energy, thermionic conversion does not require either an intermediate form of energy or a working fluid, other than electrical charges, in order to change heat into electricity.

In its most elementary form, a conventional thermionic energy converter consists of one electrode connected to a heat source, a second electrode connected to a heat sink and separated from the first electrode by an intervening space, leads connecting the electrodes to the electrical load, and an enclosure. The space in the enclosure is either highly evacuated or filled with a suitable rarefied vapor, such as cesium.

The essential process in a conventional thermionic converter is as follows. The heat source supplies heat at a sufficiently high temperature to one electrode, the emitter, from which electrons are thermionically evaporated into the evacuated or rarefied-vapor-filled interelectrode space. The electrons move through this space toward the other electrode, the collector, which is kept at a low temperature near that of the heat sink. There the electrons condense and return to the hot electrode via the electrical leads and the electrical load connected between the emitter and the collector.

The flow of electrons through the electrical load is sustained by the temperature difference between the electrodes. Thus, electrical work is delivered to the load.

Thermionic energy conversion is based on the concept that a low electron work function cathode in contact with a heat source will emit electrons. These electrons are absorbed by a cold, high work function anode, and they can flow back to the cathode through an external load where they perform useful work. Practical thermionic generators are limited by the work function of available metals or other materials that are used for the cathodes. Another important limitation is the space charge effect. The presence of charged electrons in the space between the cathode and anode will create an extra potential barrier which reduces the thermionic current.

Typical conventional thermionic emitters are operated at temperatures ranging from 1400 to 2200 K and collectors at temperatures ranging from 500 to 1200 K. Under optimum conditions of operation, overall efficiencies of energy conversion range from 5 to 40%, electrical power densities are of the order of 1 to 100 watts/cm$^2$, and current densities are of the order of 5 to 100 A/cm$^2$. In general, the higher the emitter temperature, the higher the efficiency and the power and current densities with designs accounting for radiation losses. The voltage at which the power is delivered from one unit of a typical converter is 0.3 to 1.2 volts, i.e., about the same as that of an ordinary electrolytic cell. Thermionic systems with a high power rating frequently consist of many thermionic converter units connected electrically in series. Each thermionic converter unit is typically rated at 10 to 500 watts.

The high-temperature attributes of thermionic converters are advantageous for certain applications, but they are restrictive for others because the required emitter temperatures are generally beyond the practical capability of many conventional heat sources. In contrast, typical thermoelectric converters are operable at heat source temperatures ranging from 500 to 1500 K. However, even under optimum conditions, overall efficiencies of thermoelectric energy converters only range from 3 to 10%, electrical power densities are normally less than a few watts/cm$^2$, and current densities are of the order of 1 to 100 A/cm$^2$.

From a physics standpoint, thermoelectric devices are similar to thermionic devices. In both cases a temperature gradient is placed upon a metal or semiconductor, and both cases are based upon the concept that electron motion is electricity. However, the electron motion also carries energy. A forced current transports energy for both thermionic and thermoelectric devices. The main difference between thermoelectric and thermionic devices is whether the current flow is diffusive (thermoelectric) or ballistic (thermionic). A thermionic device has a relatively high efficiency if the electrons ballistically go over and across the barrier. For a thermionic device all of the kinetic energy is carried from one electrode to the other. The motion of electrons in a thermoelectric device is quasi-equilibrium and diffusive, and can be described in terms of a Seebeck coefficient, which is an equilibrium parameter.

In structures with narrow barriers, the electrons will not travel far enough to suffer collisions as they cross the barrier. Under these circumstances, the thermionic emission theory is a more accurate representation of the current transport. The current density is given by:

$$j = A_0 T^2 e^{\frac{-e\varphi}{\kappa T}},$$

where $A_0$ is the Richardson's constant, $\Phi$ is the barrier height (electron work function), e is the electron charge, $\kappa$ is Boltzmann's constant, and T is the temperature. Richardson's constant $A_0$ is given by $A_0 = (em\kappa^2 T^2)/(2\pi^2 \hbar^2)$, where m is the effective electron mass and $\hbar$ is Plank's constant.

The diffusion theory is appropriate for barriers in which the barrier thickness (length) is greater than the electron mean-free-path in one dimension, while the thermionic emission theory is appropriate for barriers for which the barrier thickness (length) is less than the mean-free-path.

However, if the barrier becomes very narrow, current transport by quantum-mechanical tunneling becomes more prominent.

There remains a need to provide a more satisfactory solution to converting thermal energy to electrical energy at lower temperature regimes with high efficiencies and high power densities.

SUMMARY OF THE INVENTION

The present invention seeks to resolve a number of the problems which have been experienced in the background art, as identified above. More specifically, the apparatus and method of this invention constitute an important advance in the art of thermionic power conversion, as evidenced by the following objects and advantages realized by the invention over the background art.

An object of the present invention is to generate high power densities and efficiencies of a typical thermionic converter, but to operate at temperature regimes of typical thermoelectric devices.

Another object of the present invention is to maintain thermal separation between the emitter and collector.

A further object of the present invention is to minimize the effects of thermal expansion.

Additional objects and advantages of the invention will be apparent from the description which follows, or may be learned by the practice of the invention.

Briefly summarized, the foregoing and other objects are achieved by an apparatus which comprises: an electrically and thermally conductive electron emitter; an electrically and thermally conductive electron collector for receiving electrons from the emitter; a solid-state barrier disposed between and in intimate contact with said emitter and collector for filtering high energy electrons transferred from the emitter to the collector; one or more electrically and thermally conductive fractional surface contacts disposed between and in intimate contact with the emitter and barrier, or the barrier and collector, or a combination thereof; a thermally and electrically nonconductive space adjacent to the fractional surface contacts and the emitter and barrier, or the barrier and collector, or a combination thereof; and an electric load connected to the emitter and collector.

In the refrigeration embodiment, carrier transport is assisted by a potential applied between the emitter and collector, and the emitter is connected to a thermal load that is cooled by heat flow to the emitter. A heat exchanger dissipates the heat from hot electrons on the collector.

BRIEF DESCRIPTION OF DRAWINGS

In order to more fully understand the manner in which the above-recited advantages and objects of the invention are obtained, a more particular description of the invention will be rendered by reference to specific embodiments thereof which are illustrated in the appended drawings. Understanding that these drawings depict only typical embodiments of the invention and are therefore not to be considered limiting of its scope, the presently preferred embodiments and the presently understood best mode of the invention will be described with additional detail through use of the accompanying drawings in which.

DETAILED DESCRIPTION OF THE INVENTION

Figure 1:
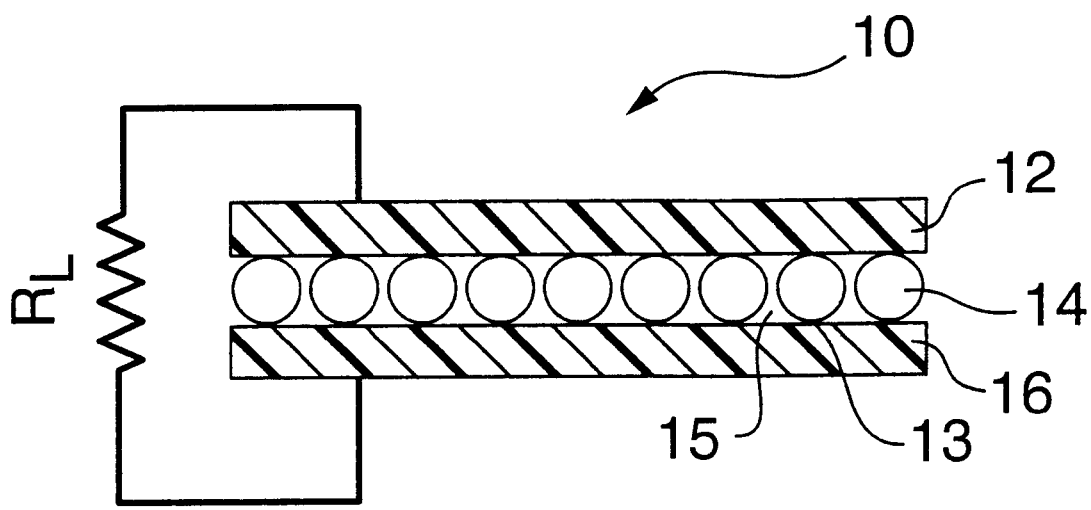
FIG. 1 is a cross-sectional view of a thermionic converter of the present invention.

The present invention embodies a thermionic energy converter 10 and is directed to a method and apparatus for conversion of energy generally illustrated in FIG. 1. The present invention 10 comprises an electrically and thermally conductive electron emitter 12, an electrically and thermally conductive electron collector 16 for receiving electrons from the emitter 12, a solid-state barrier 14 disposed between and in intimate contact with said emitter 12 and collector 16 for filtering high energy electrons transferred from the emitter 12 to the collector 16, and an electric load connected to said emitter 12 and collector 16.

The present invention 10 maintains a thermal separation between the emitter 12 and the collector 16 through a fractional surface contact 13, such as that shown in FIG. 1. Maintaining a thermal separation between the emitter 12 and the collector 16 provides for ballistic electron transport through barrier 14 and reduces the transport of phonons and electrons through thermal conductivity. Hence, the efficiency is increased through the collection of ballistic electrons and the reduction of thermal conductivity electrons which cannot be collected. It is also important to note that the inventive principle works for hole conductivity, as well as for electrons. Also, reference to metals herein includes alloys.

The fractional surface contact 13 is defined by a fractional surface geometry of decreasing cross-sectional area towards fractional surface contact 13. For example, FIG. 1 illustrates a fractional surface contact 13 which is defined by a barrier 14 comprised of spherical particles, wherein the fractional surface geometry is a spherical shape. The fractional surface contacts may be integral to the emitter 12, the barrier 14, or the collector 16. The emitter 12, barrier 14, or collector 16 has one or more fractional surface contacts 13 disposed between and in intimate contact with the emitter 12 and barrier 14, or the barrier 14 and collector 16, or a combination thereof.

The fractional surface contact 13 also provides for quantum mechanical tunneling, for example, along the non-contacting surface of the fractional contact 13 and between the collector 16 at a distance of 50 Å or less. This distance depends upon the materials utilized and their corresponding work functions. The fractional surface contact 13 also provides for thermionic emission facilitated by the reduction in the barrier height from image force effects, for example, along non-contacting surface of the fractional contact 13 and between the collector 16 at a distance of 25 Å or less. This distance also depends upon the materials utilized and their corresponding work functions. See Coutts, T. J. *Electrical Conduction in Thin Metal Films.* N.Y., Elsevier Scientific Publishing Co., 1974, pp. 54–55, for a discussion of the image force effect.

Figure 2:
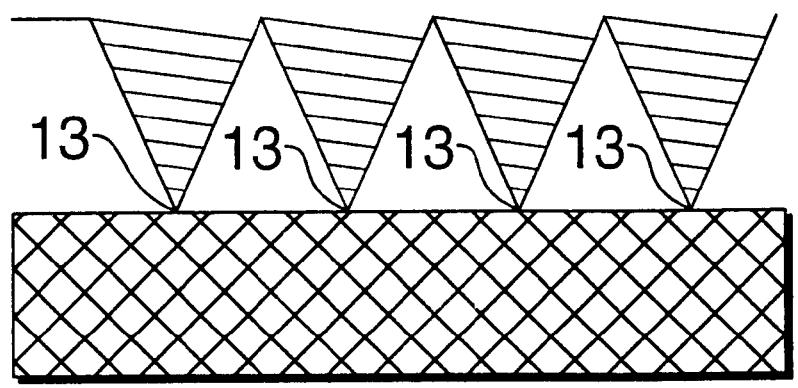
FIG. 2 illustrates a cross-sectional view of a fractional surface contact having a triangular cross-section.

FIG. 2 illustrates a fractional surface contact 13 having a triangular cross-section that acts as point emitters or contacts. Other examples of various fractional surface contact shapes include, but are not limited to, parabolic-shaped contacts, elliptical-shaped contacts, curved-shaped contacts, nanotubes, particles, dendrites made from methods such as micro-lithography and holographic lithography, Tonks' method (electric instability on liquid metal surface), ion milling, or equivalents thereof.

A thermally and electrically nonconductive space 15, including but not limited to a vacuum, xenon, radon, or other nonconductive gas, is adjacent to the fractional surface contacts 13 and the emitter 12 and barrier 14, or the barrier 14 and collector 16, or a combination thereof. Space 15 reduces electrons that would otherwise be thermally transported and assists in maintaining a thermal separation between the emitter 12 and the collector 16.

Electron flow occurs when an electrical load $R_L$ is connected to the emitter 12 and collector 16, where the work function of the emitter 12 is less than the work function of the collector 16. When determining the load resistance, it is noted that the maximum efficiency for any electric power source normally occurs when the internal resistance of the power source is the same as the load resistance. Therefore, if the internal resistance is very low, the desired load resistance should also be very low.

If the barrier 14 is adjusted to sort hot electrons, the emitter 12 will be cooled and the electron current will result in the potential increase on the collector 16. To achieve a desirable converter efficiency, the barrier 14 must effectively stop electrons with lower energies. The emitter 12 and the barrier 14 are matched such that electron concentration on the emitter 12 is higher than electron concentration on the collector 16 at a given energy defined by the barrier height.

Utilizing materials with a low reflectance on the emitter side and a high reflectance on the collector side are beneficial for maintaining a high efficiency.

1. Emitter

The emitter 12 comprises an electrically and thermally conductive material, such as metals, metal alloys, semiconductor or doped semiconductor materials. The emitter 12 may also comprise an electrically and thermally conductive layer on a substrate, such as materials including, but not limited to, $SiO_2$, glass, quartz, or equivalents thereof, coated with a metallic layer or other thermally and electrically conductive material.

Another embodiment of the present invention wherein the fractional surface contact is associated with the emitter utilizes a high phonon energy material as the emitter 12, preferably with a mean energy of at least about 3 kT, to distort the electron energy distribution using electron-phonon interaction. Materials exhibiting these characteristics are metal hydrides $Me_xH_y$, irrespective of stoichiometry. Examples include, but are not limited to, $TiH_x$, $VH_x$, $ZrH_x$, $NbH_x$, $TaH_x$, $ScH_x$, $YH_x$, $ThH_x$, $UH_x$ all rare earth hydrides, or combinations thereof. Many metals which form hydrides may be alloyed with normal metals even to high concentrations without losing the high energy component in their phonon spectrum and may have better properties in terms of oxidation, e.g., TaCu or TiCu alloys. The emitter 12 should also provide thermal and electrical conductivity.

Figure 3:
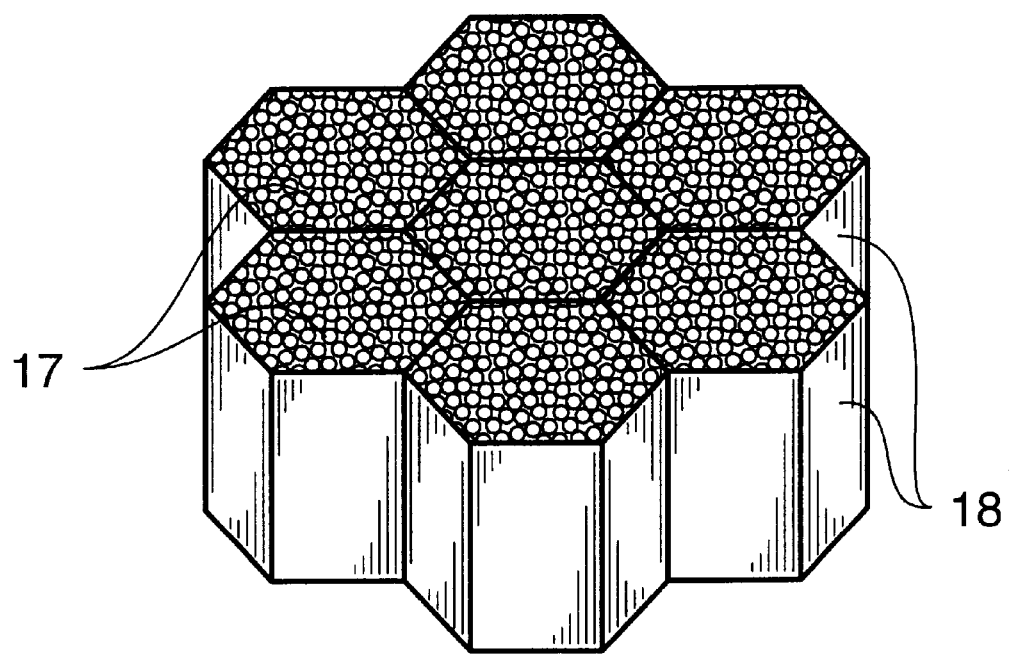
FIG. 3 shows a perspective view of an emitter utilizing tantalum-hydride powder with a honeycomb structure to support the powder.

FIG. 3 illustrates an example of an emitter comprising a metal hydride powder 17 supported in a honeycomb structure 18.

In general, all metal hydrides $Me_xH_y$ have median phonon energy in their spectra of more than 100 meV, with the exception of Pd and Pd alloys. $Me_xH_y$ is preferable over $Me_xD_y$ (or $Me_xT_y$), since the $_1H^1$ isotope is lighter and provides higher phonon frequencies (energies). It should also be noted that the phonon frequency is basically independent of the hydrogen concentration (See Landolt-Börnstein, *Numerical Data and Functional Relationships in Science and Technology, Group III: Crystal and Solid State Physics,* (1983) Vol. 13b *Metals: Phonon States, Electron States and Fermi Surfaces,* pp. 333–354, the contents of which are specifically incorporated herein.).

Other stable materials with high phonon energies include, but are not limited to, BH, $B_4C$, BN (hexagonal), BN (cubic), diamond, or combinations thereof. An emitter 12 using a non-conductive substrate must also have a conductive or doped layer, such as silver, with a thickness less than the electron mean free path, in order to emit electrons into the barrier 14. Alternatively, the conductive or doped layer may be placed on the barrier 14 when the emitter 12 comprises a thermally and electrically non-conductive material. A conductive or doped layer provides thermal and electrical conductivity. For example, if the emitter 12 comprises BN microspheres and the conductive or doped layer comprises Ag (electron mean free path is 400 Å), the conductive or doped layer thickness is preferably between 50–200 Å.

2. Barrier

Figure 4A:
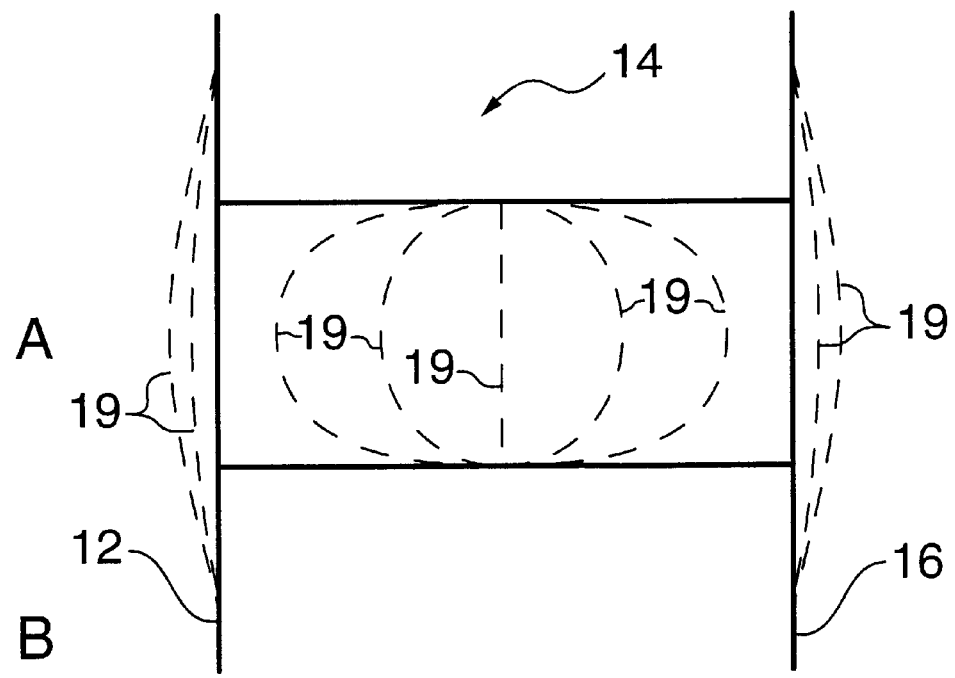
FIGS. 4A and 4B shows a cross-sectional view of a low thermal conductivity semiconductor barrier placed in a vacuum between a metal emitter and a metal collector.
Figure 4B:
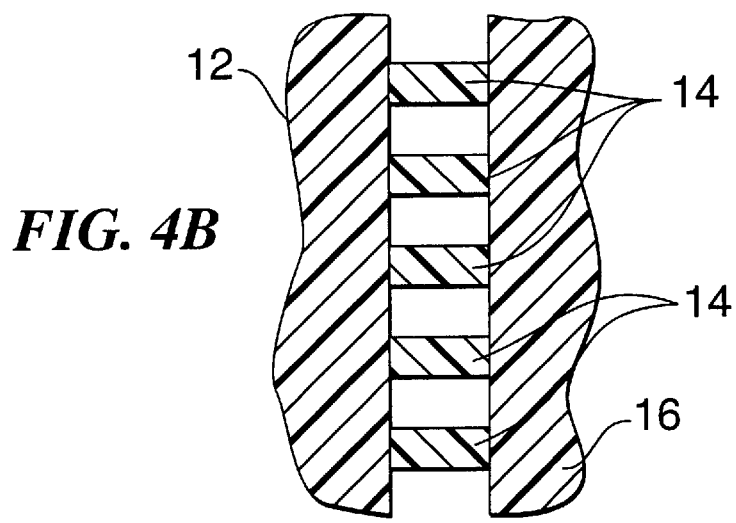
Figure 5:
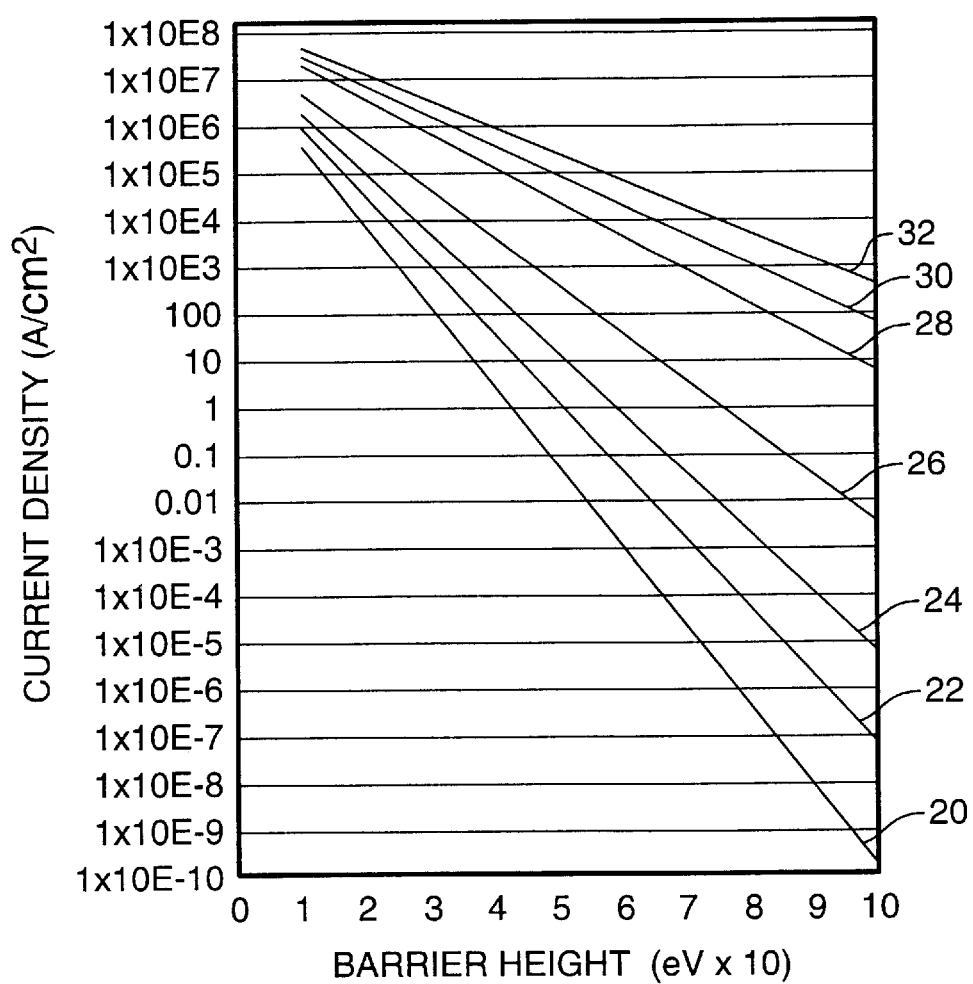
FIG. 5 illustrates a plot of Richardson thermionic current density versus barrier height at various temperatures.

Most semiconductors with a low forbidden gap have a very low thermal conductivity, such as a few W/(m·K), or roughly 100 times less than for copper or silver. This provides for a barrier geometry selection corresponding to at least a few degrees of thermal separation between the emitter 12 and the collector 16. This embodiment is illustrated in FIGS. 4A and 4B, wherein a low thermal conductivity semiconductor barrier 14 (e.g., fixed pillars, microspheres, etc.) is placed in a vacuum between a metal emitter 12 and a metal collector 16. The emitter 12 is at a higher temperature than the collector 16. Isotherms (different scale in two materials) are indicated by dashed lines 19. The spacing of isotherms 19 is much larger in metals due to a larger thermal conductivity. Estimations for a thermal conductivity difference of 100:1 result in a bridge cross-sectional linear dimension (e.g., diameter) of up to one micron. Area A will then emit electrons, since it is facing a low barrier on a metal-semiconductor interface (a fraction of 1 eV). Area B will not emit electrons, since it is facing a metal-vacuum interface with a few eV potential barrier. The ratio of area A to area B will define the decrease in the thermal conductivity of the gap (without a radiation component). For example, a 1:100 ratio provides for a thermal separation of 100 K between the emitter 12 and collector 16. Decreasing the emitter 12 area by 100 times will require relatively high current densities. A graph of the Richardson current density as a function of the barrier height and temperature is shown in FIG. 5. Line 20 represents values at 300 K; line 22 represents values at 350 K; line 24 represents values at 400 K; line 26 represents values at 500 K; line 28 represents values at 700 K; line 30 represents values at 800 K; and line 32 represents values at 900 K. For instance, a 1 W device having a total area of 1 cm$^2$ and a temperature of 400 K on the emitter 12, will require a Richardson current of approximately $10^3$ A/cm$^2$. This current can be achieved with a barrier of 0.35 eV, such as PbTe. $10^4$–$10^5$ A/cm$^2$ is an electromigration practical limit for doped semiconductors with a small forbidden gap.

Figure 6:
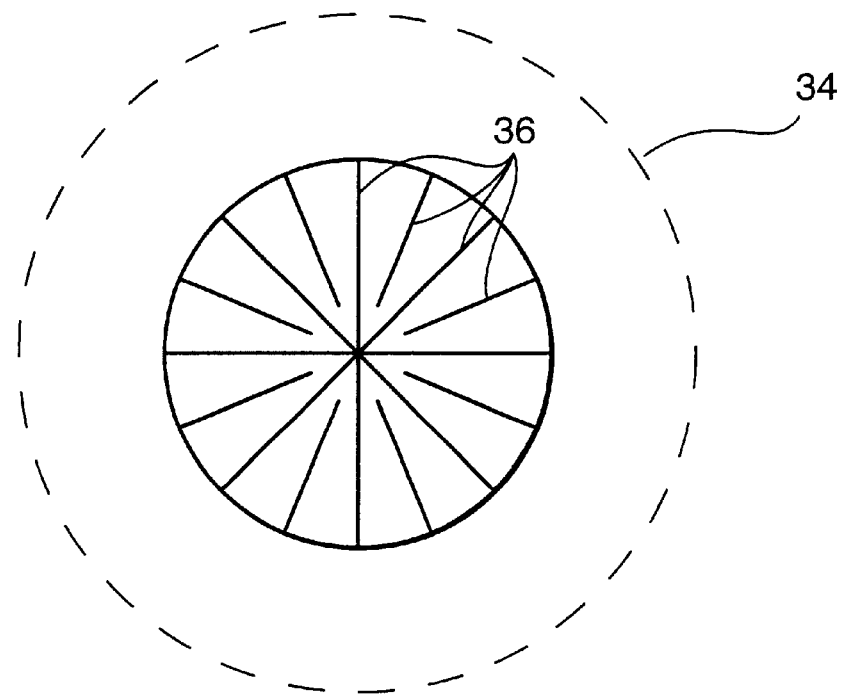
FIG. 6 illustrates the thermal expansion pattern and nanowire positioning for a circular plate.
Figure 7:
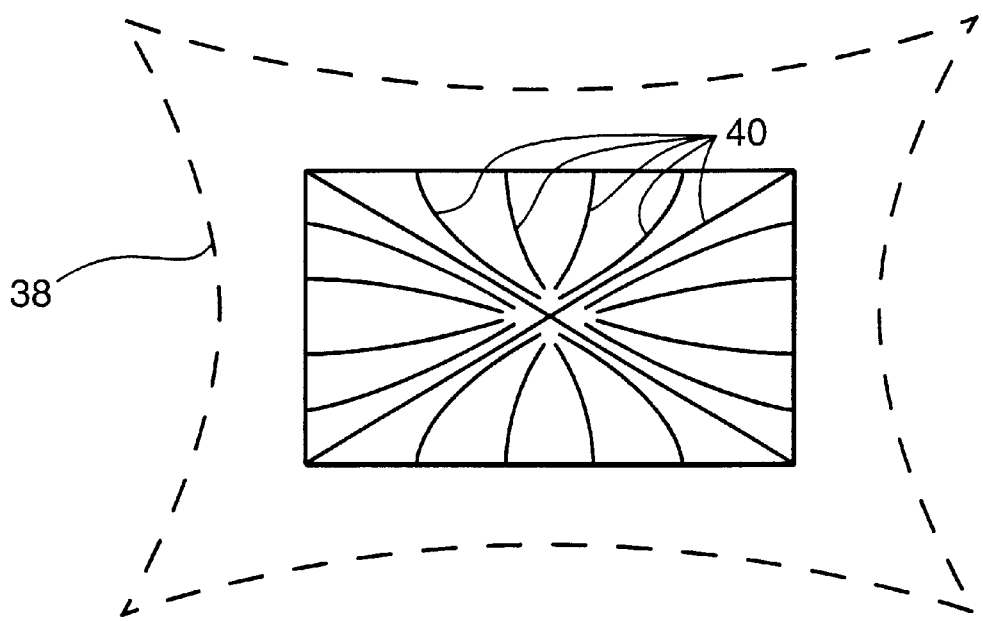
FIG. 7 illustrates the thermal expansion pattern and nanowire positioning for a rectangular plate.

The embodiments illustrated in FIGS. 4A and 4B can be constructed with known techniques such as microlithography or holographic lithography. However, thermal expansion characteristics must be considered for certain materials. For example, a 1 cm$^2$ metal plate end with a thermal expansion coefficient of $10^{-5}$K$^{-1}$ will travel $10^5$ Å at a 100 K temperature change, which is inconsistent with a bridge length of only a few hundred angstroms. Therefore, the barrier 14 preferably should be a moveable (rolling or sliding) barrier. A moveable barrier 14 may comprise microspheres or short microwires disposed between an emitter 12 and a collector 16. Microspheres are preferable because of an absence of thermal expansion and orientation challenges. The microsphere embodiment is illustrated in FIG. 1, wherein 5–100 nanometer-size semiconductor spheres 14 are available from precipitation, aerosol, or plasma spray manufacturing methods. However, advances in submicron lithography make the nanowire approach feasible from a technological point of view. The nanowire approach requires uniform and stress-relieved materials on both the emitter 12 and collector 16 sides. The simplest design is a circular plate which expands radially. FIG. 6 illustrates the expansion pattern 34 and nanowire positioning 36 of a circular plate. It should be noted that plate movement across the nanowire may cause degradation after a few thermal cycles, and should be avoided. A rectangular plate provides a more complex thermal expansion pattern 38, as illustrated in FIG. 7. FIG. 7 shows that nanowire positioning 40 is relatively complex and will be effective when the absolute size change is relatively small to avoid second order effects. The plate preferably should have a small thermal expansion coefficient to minimize the absolute size change at elevated temperatures.

Figure 8:
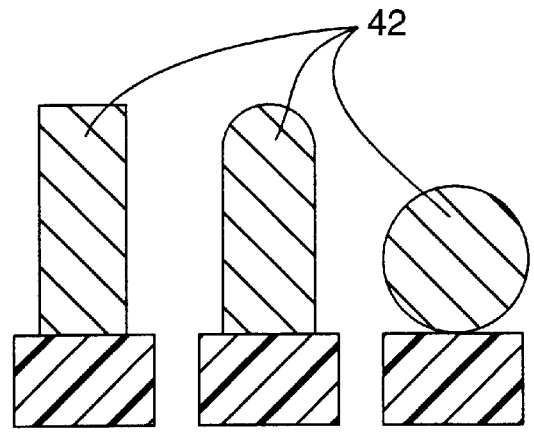
FIG. 8 illustrates various nanowire cross-sections.

Circular and rectangular emitter 12 and collector 16 plate geometries are not the only possible configurations. However, each configuration has its own thermal expansion pattern, which must be analyzed mathematically with the nanowire orientation designed accordingly. A nanowire cross-section can vary depending upon the materials used, operating temperatures, and temperature gradients. Some example cross-sections 42 include, but are not limited to, those illustrated in FIG. 8.

The potential barrier for electrons with this embodiment can be formed only with Schottky barriers. Examples of known Schottky barriers for some of the semiconductors in contact with metals are shown in Table 1 below. This list can be expanded for basically any Schottky barrier, or when comparing an interface material's electron work function with the vaccum energy level (See *Band Structure Engineering in Semiconductor Microstructures*, NATO ASI Series, Series B: Physics, Vol. 189 (1988), p. 24. Lerach, L. and Albrecht, H. *Current Transport in Forward Biased Schottky Barriers on Low Doped n-Type InSb*, North-Holland Publishing Co., 1978. pp. 531–544.; Brillson, L. *Contacts to Semiconductors, Fundamentals and Technology*, Noyes Publications, 1993; Rhoderick, E. H. and Williams R. H. *Metal-Semiconductor Contacts*, Second Edition, Clarendon Press, 1988.). Positioning of the spheres 14 may be made by precipitation from a liquid, dielectrophoresis, vibration/charge, masking or equivalents thereof. For example, dielectrophoresis involves a powder assuming a charge in a dielectric medium, such as ethyl alcohol. It is important to use fresh ethyl alcohol, since the alcohol will pick up water from the atmosphere. This will make the medium somewhat conductive and the process will degrade. The charge moves when an electric field is applied. The controls for coating are the voltage applied and the concentration of powder in the mixture. The powder is dispersed by ultra sonics or shaking.

As set forth previously, if the emitter 12 comprises a non-metallic material, a metallic layer may be placed on either the emitter 12 or the barrier 14. For example, the barrier 14 comprising microspheres illustrated in FIG. 1 would include an outer metallic layer and metal contacts placed on the emitter 12.

| Material | Barrier (eV) |
|---|---|
| Si | 0.5–0.8 |
| n-Ge | 0.18–0.45 |
| n-GaAs | 0.70 |
| n-InAs | 0.50 |
| n-GaSb | 0.07 |
| n-InSb | ~0.01 |
| Sb | ~0.1 |
| n-PbS | ~0.2 |
| n-PbSe | ~0.2 |
| p-Cu$_2$O | 0.4 |
| p-Se | 0.30–0.55 |
| n-CdS | 0.88 |
| DySi$_2$ | 0.37 |
| IrSi$_3$ | 0.94 |
| Hg$_{1-x}$Cd$_x$Te | 0.0–0.5 |
| p-Ge | 0.26 |
| B$_{(amorphous)}$ | 0.43 |
| LaB$_6$ | 0.35 |

-continued

| Material | Barrier (eV) |
|---|---|
| $YbB_6$ | 0.30 |
| $Pd_2Si$ | 0.7 |
| n-PbTe | 0.32 |
| p-GaAs | 0.55 |
| n-InP | 0.32–0.54 |

$Hg_{1-x}Cd_xTe$ given in Table 1 has preferably a stoichiometry such that x is within the range from about 0 to about 0.3.

Table 1 shows various materials having a barrier height in the range of 0.1 eV to 1.0 eV. All practical temperatures are included in FIG. 5 for the materials listed in Table 1. For example, n-GaAs or $Pd_2Si$ (0.7 eV) are acceptable barrier materials at an operation temperature of 800 K, 1:100 area coverage, and $10^3$ A/cm$^2$ current limit through the barrier material ($\approx$1 W/cm$^2$ converter specific power). Semiconductors may also be doped with impurities that provide for sub-band conduction. For example, doping Ge with Te provides a donar sub-bandwith of 0.3 eV spacing from the conductance band bottom, thus changing the intrinsic surface barrier by a value of 0.15–0.20 eV.

An example of the embodiment illustrated in FIG. 1 may comprise semiconductor spheres with a 100 Å diameter deposited on a variety of substrates with a desired density per unit area by methods such as laser ablation, or equivalents thereof. The surface finish on semiconductors and dielectrics is preferably within a few angstroms RMS; however, the surface must be metallized. Metal coatings with a 10 Å RMS surface are routine with magnetron sputtering. Standard optical polishing provides 1–3 arcmin. parallelism. Without a flexible plate on one side, the absence of electrical shorts can only be guaranteed over a distance of about 100 microns. Materials having a thickness of approximately 0.1 mm or less such as glass, quartz, Si, Ge, mica, or equivalents thereof, will function as a local spring and compensate for parallelism if a thermally conductive cushion such as carbon fibers, or equivalents thereof, are used as an intermediate layer for compression.

Figure 9:
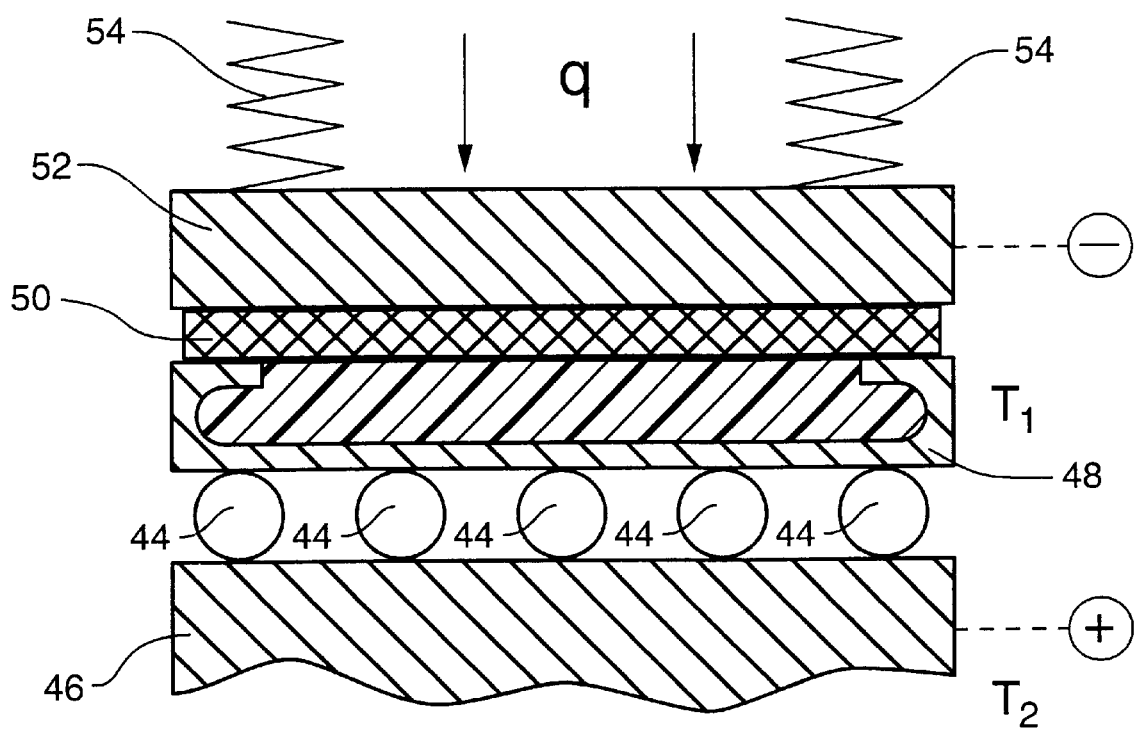
FIG. 9 is a cross-sectional view of an embodiment of the present invention wherein the fractional surface contact is associated with the barrier.

To illustrate thermal management and compression challenges, the embodiment shown in FIG. 9 comprises 100 Å germanium spheres 44 between two ideally smooth molybdenum 46 or molybdenum coated plates 48 of 1×1 cm$^2$ squares, with a 100 K temperature difference between plates 46 and 48 and a 10 W heat flow across the converter. One of the plates 46 or 48 is thin enough (e.g., 10–20 microns) to be sufficiently flexible to compensate locally for parallelism problems.

The heat flow q is supplied by a heat source (not shown). A thermal differential is maintained between the cold plate 46 at a temperature $T_2$ and a hot plate 48 at a temperature $T_1$. In this case, $T_1-T_2=100$ K. Plate 48 is made of a silicon wafer material having a thickness of 10 microns and metallized with a 2000 Å molybdenum coating on both sides. Ge nanospheres 44 are deposited by laser ablation onto plate 46. A thin layer of carbon fibers 50 provide for a uniform load on the plate 48 and conduct heat and electrical flow through the flat compressing plate 52. The mechanical load on the nanospheres 44 is regulated by calibrated springs 54. In principle, the springs 54 may also be attached to plate 46 instead of plate 52. The compression force supplied by springs 54 defines the deformation of the spheres 44, and indirectly defines the thermal and electric contact properties on the sphere-plate interface. The entire device is enclosed in a vacuum chamber and evacuated to a residual pressure below 5×10$^{-4}$ torr. At this pressure the thermal conductivity of air is smaller than the radiative losses at room temperature (see Kaganer, M. G. *Thermal Insulation in Cryogenic Engineering*. Israel Program for Scientific Translations Ltd. 1969. Pp7–106.). Kaganer discusses that the thermal resistance on the interface is a complex function of many parameters. For simplicity, the following example assumes that the thermal resistance of the sphere 44 is equivalent to a rod having a cross-section of 1000 Å$^2$. The specific heat flow ($q_1=\kappa\partial T/\partial y$) through one contact with a thermal conductivity, $\kappa$, value of 40 W/(mK) for germanium, yields a value of 4×10$^{-6}$ W. To maintain a 100 K temperature gradient at 10 W total heat flow requires 2.5×10$^6$ spheres, or approximately 6 micron spacing between the spheres 44, which corresponds to about 3 arcminutes of plate parallelism that is standard for thin silicon wafers.

It can be assumed that under compression the Ge sphere 44 will deform and the plate 46 will remain flat since the elasticity modulus for Mo (300 GPa) is much higher than for Ge (82 GPa). The calculations show that approximately a 10$^{-7}$ N force is required to provide 100 Å contact area. The total compressive force in this case will be 0.25N, which is relatively small and allows for only a partial plate parallelism compensation with a 10 micron thick silicon plate. Improved results are possible with thinner plates or a more flexible plate material such as glass.

The previous example also illustrates the optimization principle for this device. If the desired temperature differential is increased to 200 K, 20 watts of heat flow must be supplied to the device. If only 10 watts are available, the number of nanospheres must be cut by two, and so forth.

Examples of various barrier 14 materials are disclosed in the following references, the contents of which are specifically incorporated herein: Burstein, E. and Lundqvist, S. *Tunneling Phenomena in Solids*. N.Y., Plenum Press, 1969. pp. 47–78, 127–134, 149–166, and 193–205. Mizuta, H. and Tanoue, T. *The Physics and Applications of Resonant Tunneling Diodes*. N.Y. Cambridge University Press, 1995. pp. 52–87. Duke, C. B. *Tunneling in Solids*. N.Y., Academic Press 1969. pp. 49–158, and 279–290. Conley, J. W. and Tiemann, J. J. *Experimental Aspects of Tunneling in Metal-Semiconductor Barriers. Journal of Applied Physics*, Vol. 38, no. 7 (June 1967), pp. 2880–2884. Steinrisser, F. and Davis, L. C. *Electron and Phonon Tunneling Spectroscopy in Metal-Germanium Contacts. Physical Review*, Vol. 176, no. 3 (Dec. 15, 1968), pp. 912–914. Hicks, L. D. and Dresselhaus, M. S. *Effect of Quantum-well Structures on the Thermoelectric Figure of Merit. Physical Review B*, Vol. 47, no. 19 (May 15, 1993), pp. 12 272–12 731. Abram, R. A. and Jaros, M. *Band Structure Engineering in Semiconductor Microstructures. Series B: Physics*, Vol. 189, N.Y. Plenum Press 1988. pp. 1–6, and 21–31. Ferry et al. *Quantum Transport in Ultrasmall Devices. Series B: Physics*, Vol. 342, N.Y. Plenum Press 1995. pp. 191–200. Shakorui, A. and Bowers, J. E. *Heterostructure Integrated Thermionic Coolers. Applied Physics Letters*, Vol. 71, no. 9 (Sep. 1, 1997), pp. 1234–1236.

One skilled in the art of applying thin barrier materials recognizes the need for cleanliness and to avoid contamination such as bacteria, foreign particles, dust, etc. It is also important to prepare a smooth surface finish on the substrate on which the barrier is placed.

Dielectrics in the pure form have extremely high barrier properties. For example, a typical forbidden gap for a dielectric is 4–6 eV. It is extremely difficult to thermally excite electrons to this kind of energy, in order to provide a significant current. Impurities and lattice defects within dielectrics provide local conductive bands that give lower barriers.

The behavior of lattice defects and impurities in dielectrics has not been extensively explored, see e.g., Hill, R. M. *Single Carrier Transport in Thin Dielectric Films.* Amsterdam, Elsevier Publishing Co., 1967. pp. 39–68, the contents of which are specifically incorporated herein. In principle, the barrier height may be controlled by changing the impurity type and concentration. Conduction by multistep tunneling through defects also provides some conductivity at a low electron energy.

One skilled in the relevant art recognizes there are a variety of deposition techniques that may be employed to form ultra thin dielectric coatings, which include, but are not limited to, CVD (chemical vapor deposition), PVD (physical vapor deposition), in their various forms such as magnetron, electron beam, pulsed laser deposition, or equivalents thereof. These deposition techniques are known for the deposition of 10–500 Å layers of dielectrics, such as $Al_2O_3$ and $SiO_2$.

The electron energy sorting barrier 14 may also utilize semiconductors, rather than dielectrics. Since the metal-semiconductor interface barrier can be selected for a desired barrier height value, a metal-semiconductor potential barrier can be more easily regulated than a metal-dielectric-metal junction. A metal-semiconductor junction exhibits tunneling properties for highly degenerated semiconductors, for example heavily doped semiconductors, which allows for thin potential barriers.

Figure 10:
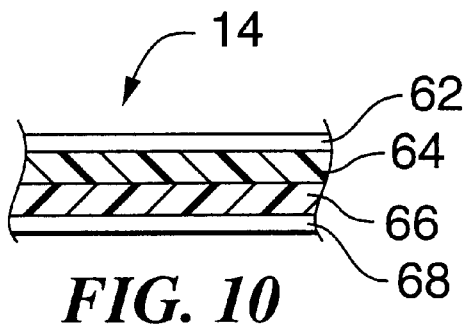
FIG. 10 is a cross-sectional view of a barrier configuration comprising a metallic layer, an n-type semiconductor layer, a p-type semiconductor layer, and a metallic layer.
Figure 11:
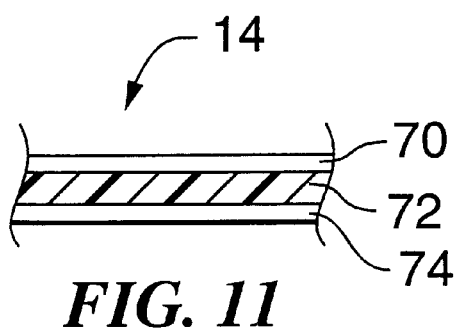
FIG. 11 is a cross-sectional view of a barrier configuration comprising a metallic layer, an n-type semiconductor layer, and a metallic layer.
Figure 12:
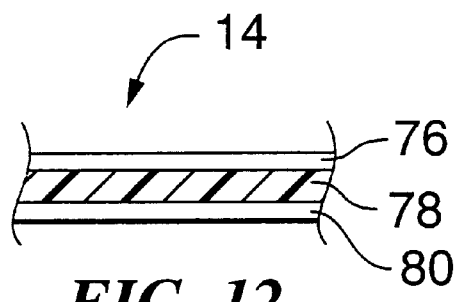
FIG. 12 is a cross-sectional view of a barrier configuration comprising a metallic layer, a p-type semiconductor layer, and a metallic layer.

Three types of semiconductor barriers can be used: (1) conductive or doped material 62/n-type semiconductor 64/p-type semiconductor 66/conductive or doped material 68 (see FIG. 10; note also that the n-type and p-type layers may be reversed); (2) conductive or doped material 70/n-type semiconductor 72/conductive or doped material 74 (see FIG. 11); and (3) conductive or doped material 76/p-type semiconductor 78/conductive or doped material 80 (see FIG. 12). In this embodiment, an electron injected into a p-type region can be accelerated by a local electric field. Examples of semiconductor materials are disclosed in the following references, the contents of which are specifically incorporated herein. See Landolt-Börnstein, *Numerical Data and Functional Relationships in Science and Technology, Group III: Crystal and Solid State Physics,* (1982) Vols. 17b–17i and (1987) Vol. 22a *Semiconductors.* Madelung, O. *Data in Science and Technology. Semiconductors Other than Group IV Elements and III–V Compounds.* N.Y., Springer-Verlag Berlin Heidelberg, 1992. pp. 1–153. Conwell, E. M., *Semiconductors I,* Bulletin of American Physical Society, Vol. 10, (Jun. 14, 1965), p. 593. Hall R. N. and Racette J. H. *Band Structure Parameters Deduced from Tunneling Experiments,* Journal of Applied Physics, Supp. to Vol. 32, no. 10 (October 1961), pp. 2078–2081.

With a forbidden gap energy $E_g$, the first barrier will have an exponential factor $E_g$ and a second exponential factor of approximately $E_g/2$ (without a Schottky barrier associated with surface defects and crystallography).

Barrier heights for semiconductors are lower than corresponding barriers for dielectrics. The barrier 14 thickness is not as crucial with a semiconductor and the barrier height can be adjusted using a proper semiconductor material. For example, the semiconductor thickness may be in the region of hundreds of angstroms (or thicker) compared to tens of angstroms required for a dielectric. A thicker barrier 14 is much easier to manufacture because it is less susceptible to pin holes, dust and other contaminants. Also, the current exponentially depends on the barrier height.

From Richardson's Equation with a semiconductor having a barrier height $\Phi$ equal to 150 meV, the current density at room temperature is very high, roughly $\geqq 10^6$ A/cm$^2$ and $\approx 10^4$ A/cm$^2$ at $\Phi$ equal to about 300 meV. Semiconductors having a barrier height of less than 0.6 to 0.7 eV may be used in this embodiment, since reasonably high current densities (>1 A/cm$^2$) may be provided.

Figure 13:
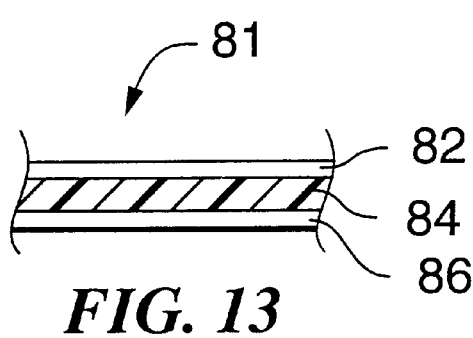
FIG. 13 is a cross-sectional view of a barrier configuration comprising a resonant tunneling diode.

A resonant tunneling (RT) barrier 81 comprises two or more barriers 82 and 86 with a spacing 84 between barriers 82 and 86 that is sufficient for electrons to form a standing wave (see FIG. 13). Spacing 84 is typically 100 Å or less and requires a precision deposition technique, such as molecular beam epitaxy (MBE), or equivalents thereof. The physics and technology of RT devices is disclosed in Mizuta, H. and Tanoue, T. *The Physics and Applications of Resonant Tunneling Diodes.* Cambridge University Press, 1995. pp. 1–235, the contents of which are specifically incorporated herein.

Figure 14:
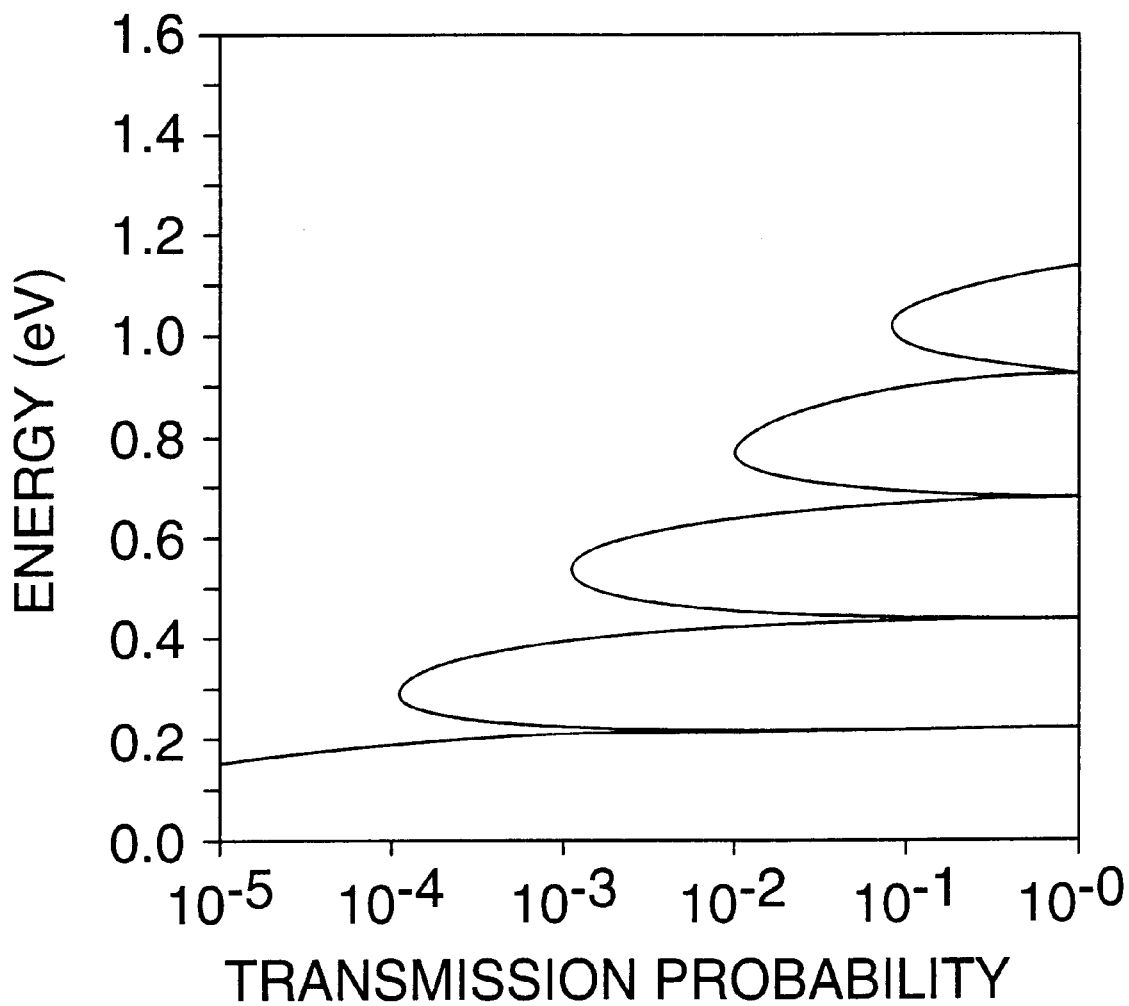
FIG. 14 shows the transmission probability for a specific GaAs—$Al_xGa_{1-x}As$ heterostructure.

The advantage of a resonant tunneling barrier 81 is in its selective electron energy dependent transmission. The example of the transmission probability for a specific $GaAs$—$Al_xGa_{1-x}As$ heterostructure is given in FIG. 14. From FIG. 14 it can be seen that there are a few transmission peaks, each one of which is a multiple of the fundamental harmonics. RT fundamental harmonics can be tuned to a first phonon harmonics of an emitter material, such as $TiH_2$. Higher harmonics will be automatically matched, thereby providing for electrons to be sorted from the Fermi distribution tail resulting in higher efficiencies. RT leak currents are extremely small compared to other types of barriers. For example, the probability of an electron with 0.1 eV energy to penetrate the RT barrier 81 is much less than for an electron with 0.25 eV energy. This type of sorting efficiency provides for a high converter efficiency.

3. Collector

Figure 15A:
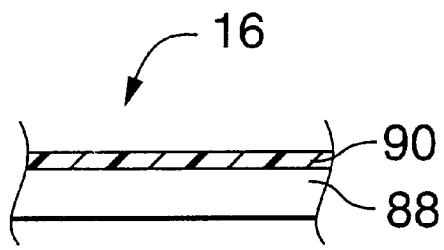
FIG. 15A shows a cross-sectional view of a nonmetallic collector with a metallic layer.

The collector 16 material must have the properties set forth below to assure proper operation of the converter. The collector 16 must provide thermal and electrical conductivity. FIG. 15A illustrates a collector 16 having a substrate 88, which is not electrically conductive, coated with a conductive or doped layer 90 for electrical conductivity. If the collector 16 is used as a substrate for the electron sorting barrier 14, it must be polished to a surface finish that is superior to the barrier 14 thickness. For example, with a barrier 14 thickness of 150–200 Å, the surface finish must be better than 50 Å over the entire collector 16. Metals meeting a surface finish requirement of <50 Å are known in the metals optics industry. Such metals include, but are not limited to, Cu, Mo, W, Al, combinations thereof, or equivalents thereof.

An alternative approach is to utilize optically polished dielectric or semiconductor collectors 16, which have good thermal conductivity and are coated with a conductive or doped material to achieve the requisite electrical conduction. Such materials include, but are not limited to, silicon, gallium arsenide, sapphire, quartz (fused silica), or equivalents thereof. These materials are readily available with a surface finish better than 10 Å. Glass has a low thermal conductivity of 1–2 W/(m·K) and is therefore only practical in low power density converters. Refractory single crystals and diamond can be used for more stringent applications.

For embodiments utilizing a high phonon energy material as the emitter 12, the collector 16 must not have a high energy component in its phonon spectrum. Moreover, the collector 16 material must have an atomic mass sufficient to have a spectrum cutoff below kT, since the phonon frequency normally decreases with the mass of a metal atom. The list of metals meeting this criteria are set forth in Landolt-Börnstein, *Numerical Data and Functional Rela-* tionships in Science and Technology, Group III: Crystal and Solid State Physics, (1981) Vol. 13a Metals: Phonons and Electron States. Fermi Surfaces, pp. 7–180, and Khotkevich et al., Atlas of Point contact Spectra of Electron-Phonon Interactions in Metals, (1995), the contents of which are specifically incorporated herein. Examples of such metals include, but are not limited to, Au, Bi, Hf, Pb, Pt, W, Zr, Ta, and Sn.

The thermal expansion coefficient of the collector 16 material preferably should be matched to that of the barrier 14 material to prevent coating peel-off during operation of the converter under thermal cycling. In addition, the collector 16 material must have sufficient mechanical integrity to withstand operation temperatures.

Figure 15B:
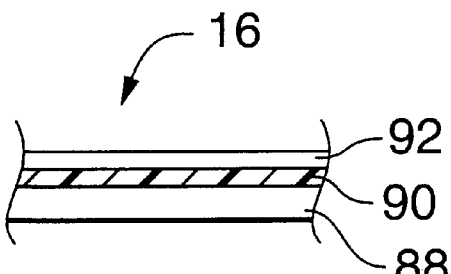
FIG. 15B shows a cross-sectional view of a nonmetallic collector with a metallic layer and a surface barrier matching material disposed between the collector and the barrier to prevent the leak back of electrons to the emitter.

When the materials of the barrier 14 and the collector 16 are not selected so as to prevent the leak back of electrons through the barrier 14, an electrically conductive, barrier matching material 92 must be disposed between the collector 16 and the barrier 14 (See FIG. 15B). The selection rule for the barrier matching material 92 with an electron work function $\Phi_c$, an emitter 12 material with an electron work function $\Phi_e$, and a barrier 14 material with an electron work function $\Phi_b$, is: $\Phi_c > \Phi_b \geq \Phi_e$. The actual $\Delta\Phi$ depends on the operating temperature and application.

The electron energy in an emitter 12, barrier 14, and collector 16 will be positioned according to their electron work function, when measuring the electron energy from the vacuum energy level as a reference point. When the work function of the collector 16 material is too low, the collector 16 functions as an additional barrier for emitted electrons and, therefore, should be avoided. Metals such as Pt or Ir have a very high work function and are preferred. However, they may not be necessary when the emitter material has a low electron work function.

4. Examples

4(a). Converter with Dielectric Barrier

A converter was assembled using an emitter comprising tantalum-hydride powder 17 housed in a honeycomb structure 18 (See FIG. 3). The converter was assembled on a rigid microscope frame with a microscopic linear positioning stage providing for a ±0.5 micron spacing regulation. A cartridge heater (Omega, 100 W) was fed with a regulated DC power supply, and thermal contact to the tantalum-hydride powder was provided by a polished copper rod. Both the heater and the rod were enclosed in Macor insulation and spring loaded to the microscope stand. A water cooled heat sink made of copper was mounted on a positioning stage with an additional laser mirror mount, which provided for 3D alignment of the contacting planes. Cooling water was supplied from a large tank at room temperature by means of a peristaltic pump at ±0.5° C. stability over a one-hour interval. The temperature of the copper rods was measured with two platinum RTDs connected to a Keithly 2001 multimeter for data acquisition (±0.02° C. accuracy). A stainless steel envelope of each RTD was also used was electric leads to make a connecting circuit between the emitter and collector. The voltage in the external circuit was measured with a Hewlett Packard model HP34420A nanovoltmeter ($R_n$=10 Gigaohm).

A sample I-V curve was measured with a Kepco ABC 25-1DM external power supply and a Keithly 2001 as an ampmeter. A resistor bank (1% accuracy) was connected in parallel with the circuit, allowing up to 0.5 Gohm loads without interfering with the nanovoltmeter. The I-V curve was defined by voltage-load measurements. The emitter powders 17 included either TaH or $TiH_2$ particles, ball-milled from an initial 10–20 micron size to 0.2–0.3 micron average particle size. The emitter was formed either by tapping the powder 17 into a low thermal conductivity honeycomb structure 18 glued to a copper plate, or by drying a powder suspension in alcohol on the copper plate. The honeycomb structure 18 utilized in this prototype was procured from Goodfellow Corporation, located in Berwyn Pa. The part number of the honeycomb structure is AR312610 having the following specifications: 5 mm thickness, 0.05 mm cell wall, and 3 mm cell size.

Figure 16:
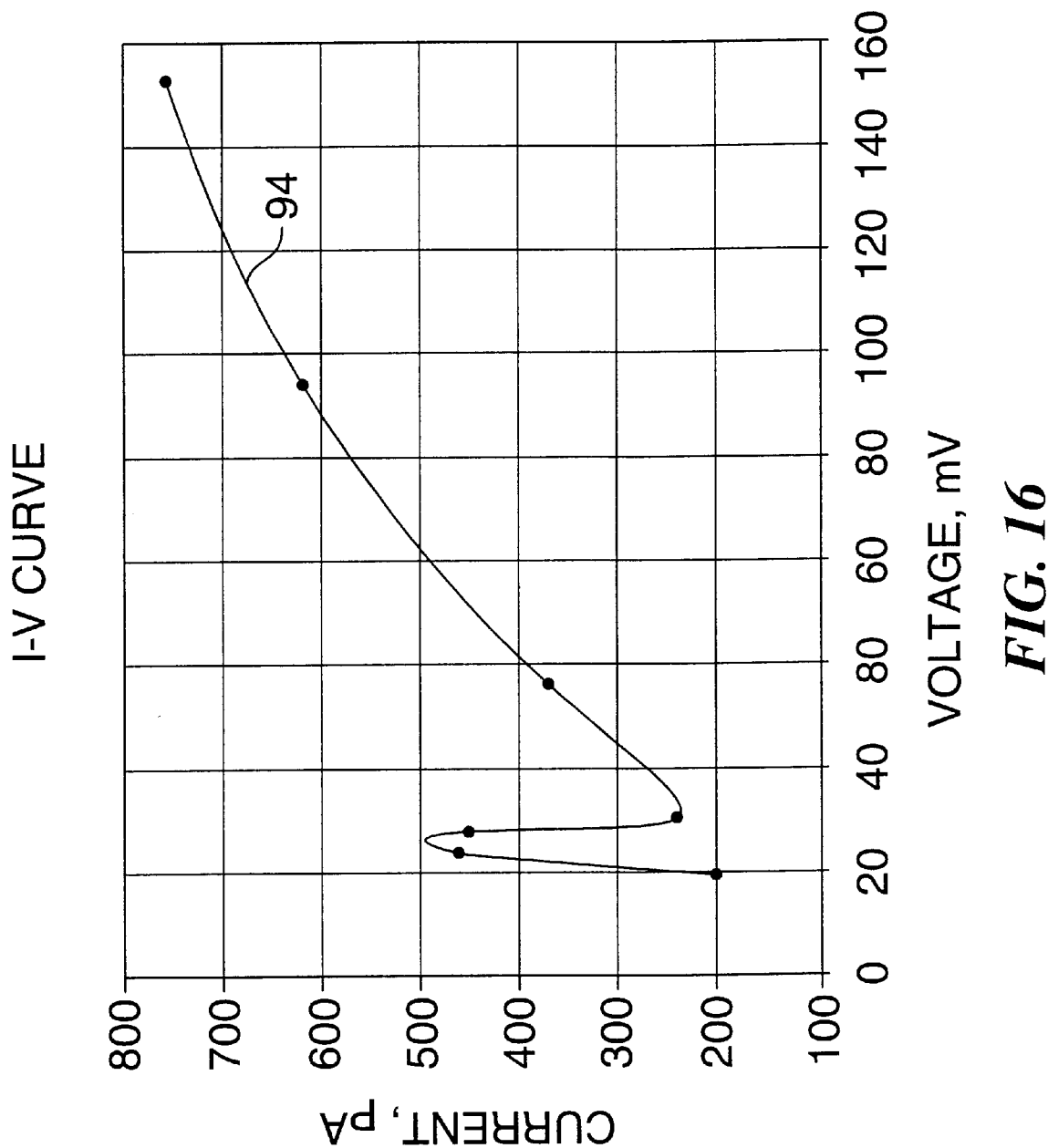
FIG. 16 is an I-V curve for an emitter comprising TaH and a barrier comprising $Al_2O_3$.
Figure 17:
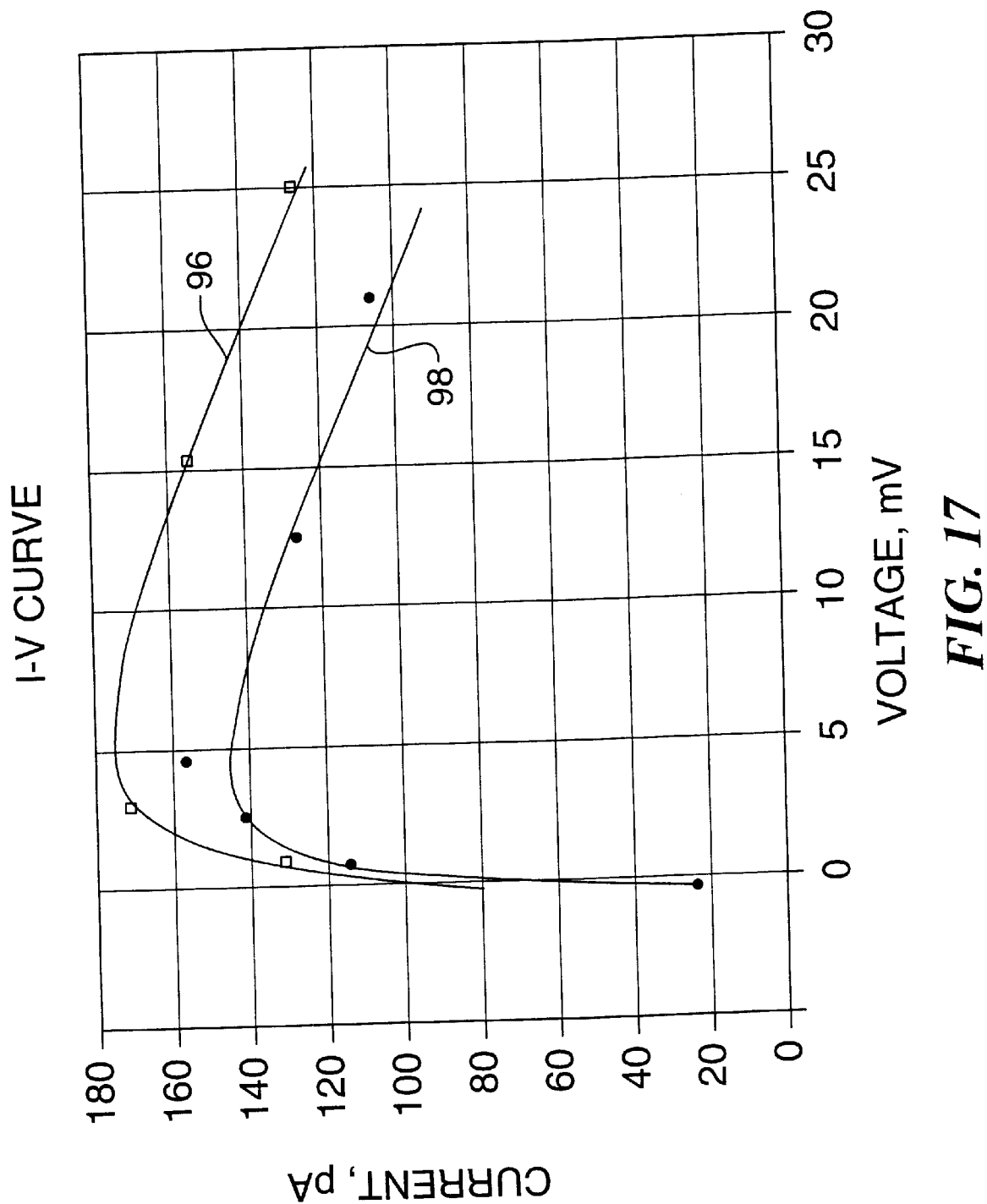
FIG. 17 is an I-V curve for an emitter comprising TaH and a barrier comprising $Al_2O_3$ at a different temperature differential than FIG. 16.
Figure 18:
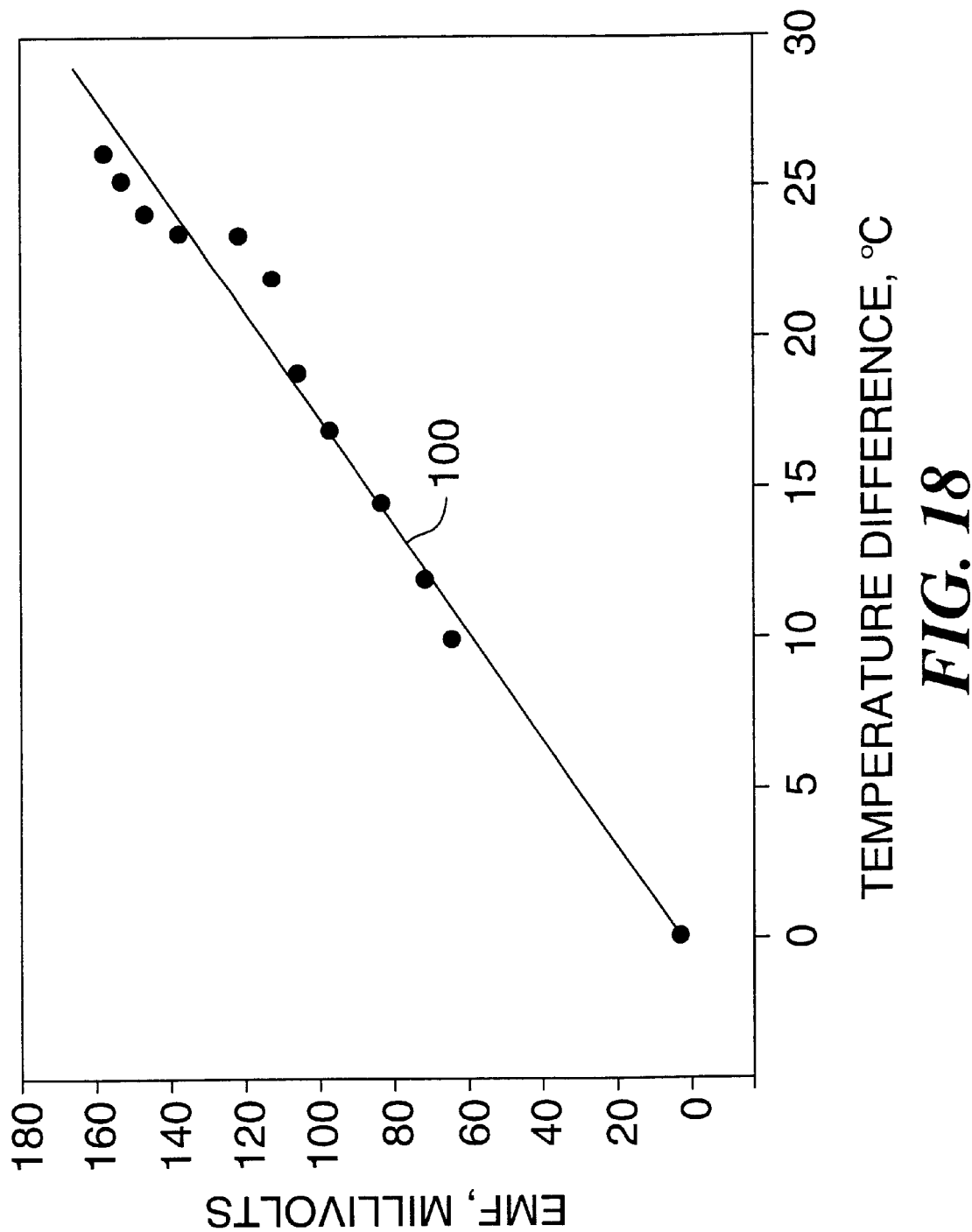
FIG. 18 is a plot of the voltage dependence on the temperature gradient for an emitter comprising TaH and a barrier comprising $Al_2O_3$.

A variety of collector substrates were tested, including metallized, optically polished sapphire, optically polished Kovar and molybdenum, and metallized optical glass. A barrier matching material 92 having a thickness of 200–500 Å was deposited on a substrate 90, for example, Ta for a TaH emitter. Dielectric layers of $Al_2O_3$ were deposited by PVD (physical vapor deposition, magnetron sputtering), or CVD (chemical vapor deposition). The impurity, or defect, concentration on the collector samples, deposited by both means, was not meticulously controlled. The minimum barrier thickness achieved, that was not electrically shorted over a 1 $cm^2$ area, was approximately 250 Å. In some samples the barrier was not shorted at room temperature, but failed at 35–40° C. The highest observed voltage was 0.22V using dielectric barriers at a temperature difference of 35° C. between the emitter and collector. The highest observed current was about 2 $\mu A$. Some of the samples had an S-type current-voltage curve, which is typical for tunneling diodes (See FIG. 16). In FIG. 16, the temperature of the emitter was approximately 31.96° C., and the temperature differential between the emitter and the collector was approximately 11.06° C. The S-curve 94 is not smooth, suggesting the existence of a localized conduction band in an amorphous dielectric. Some samples had I-V curves 96 and 98 resembling the initial portion of a tunneling S-curve (See FIG. 17). For I-V curve 96, the temperature of the emitter was approximately 22.5° C., and the temperature differential between the emitter and the collector was approximately 3.1° C. For I-V curve 98, the temperature of the emitter was approximately 24.5° C., and the temperature differential between the emitter and the collector was approximately 5.4° C. In FIG. 18, line 100 indicates the voltage dependence on the temperature gradient, which was basically linear for most of the samples. The linear V(T) line 100 indicates a phonon mechanism, which should depend linearly on the heat flow through the sample. The heat flow is a linear function of the temperature difference, while the electron distribution is an exponential function with temperature.

These tests provided an initial proof-of-concept for a converter with a voltage output of up to 10–15 mV/K, which is significantly higher than any known thermoelectric device. The current density for the converter utilizing an $Al_2O_3$ barrier was low, which is expected for relatively thick barriers and the absence of conduction band control. However, the conduction band can be engineered. Continuous layers of $Al_2O_3$ are taught in the literature, with some as low as 20 Å, and a factor of $10^6$ times gain on current can be achieved.

4(b). Converter with Semiconductor Barrier

A converter was made utilizing PbTe coatings as a semiconductor barrier, deposited by magnetron sputtering. The magnetron sputtering target was 99.99% pure p-type PbTe doped with Al to 0.3–0.5 atomic %. PbTe has a high electron work function (4.8–5.1 eV) that creates challenges in forming a barrier that will prevent a backflow of electrons. Only a limited number of metals have a higher electron work function, such as Pt and Au. A polished glass substrate was coated with 3000 Å layer of Ta for electrical conductivity, with 500 Å of gold barrier matching, and 350 Å of PbTe as a barrier material. The Schottky barrier height in this case was not known.

At PVD temperatures of 100–200° C., PbTe usually forms a crystalline coating. The deposition temperature of the sample in this case was 30–100° C.; therefore, an amorphous costing is not excluded.

Test results are shown below in Table 2, wherein a TaH powder emitter was utilized with a cross-sectional area of 17 mm$^2$. The emitter temperature was 26.9° C. and the collector temperature was 22.0° C.

TABLE 2

| Resistive Load (ohms) | Output Voltage (mV) |
|---|---|
| 10$^6$ | 5.2 |
| 10$^4$ | 2.7 |
| 10$^3$ | 2.4 |
| 500 | 2.3 |
| 100 | 2.2 |
| 10 | 0.020 |

The result show that the "over the barrier" current was apparently not achieved, since the voltage spead is too small, e.g., 5.2 mV when compared to an expected range of more than 100 mV. This means that the actual potential barrier in this case was more than, or closer to, 1 eV. The conductivity appears to be similar to a phonon-assisted impurity conductor band conductivity in a dielectric. Nevertheless, the recalculated efficiency of this device was 5.7% of an ideal Carnot cycle without accounting for the thermal conductivity of air. The efficiency is 6.6% when taking into account the thermal conductivity of air at temperature of 300 K and a temperature differential of 4.9 K. The measurement errors were insignificant with 10$^{-3}$% on the voltage side, 1% on the resistance (current) side, and 0.02° C. on the temperature side. The temperature drift during the test was less than 0.2° C.

4(c). Converter with Semiconductor Barrier

A converter, similar in construction to the converter constructed in Section 4(b) above, was constructed from the same PbTe sputtering target (0.3–0.5 atomic % doping with Al). The main difference between the present converter and that in Section 4(b) was the collector substrate, which was polished to 50 Å RMS surface finish aluminum (15×12×3 mm$^3$). The Al was coated with 3000 Å of Ta and 300 Å of Pt. The PbTe layer on top of the Pt layer was 240 Å. Also, the emitter comprised TiH$_2$ microspheres.

Figure 19:
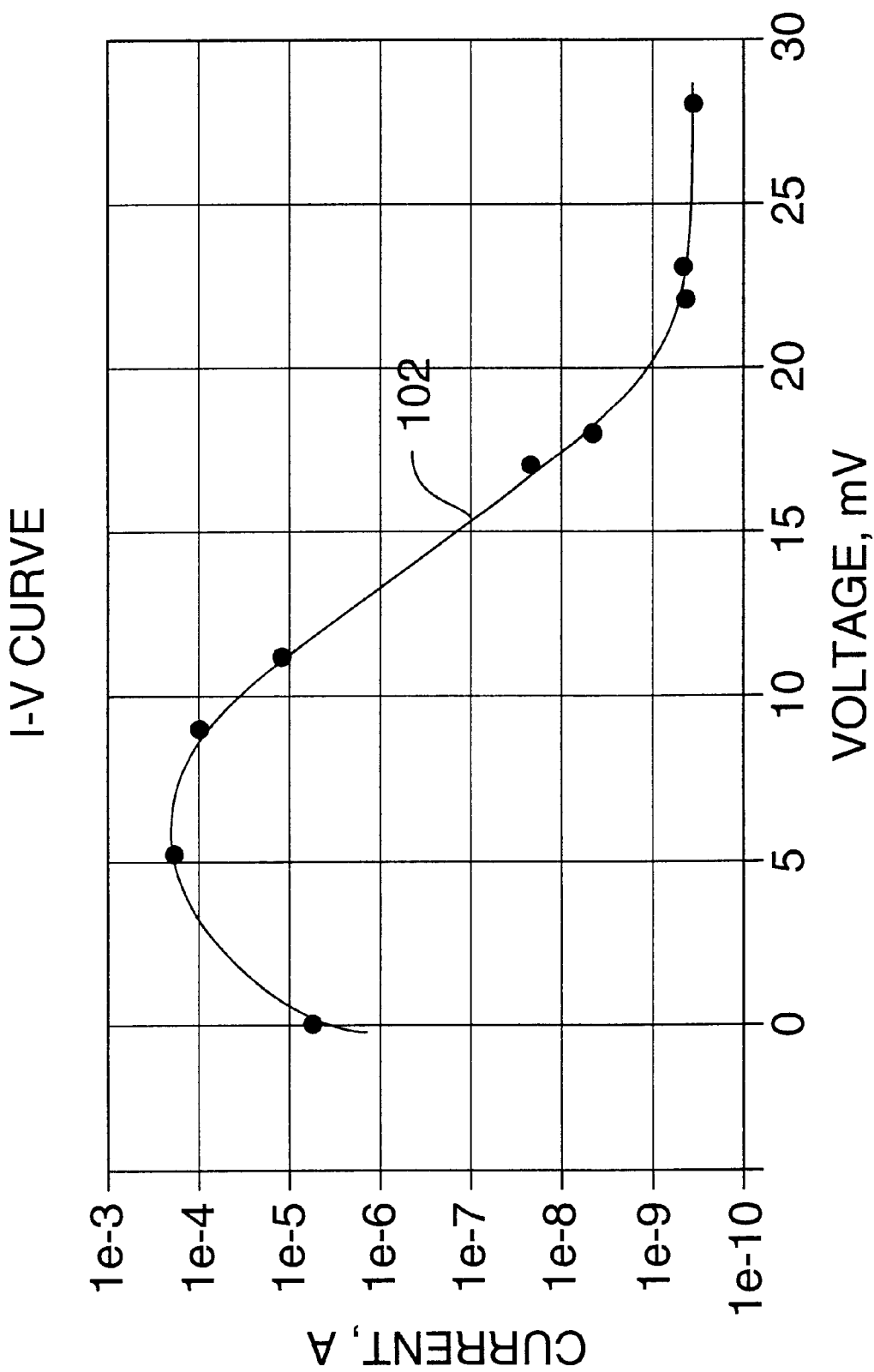
FIG. 19 is an I-V curve for an emitter comprising $TiH_2$, a barrier comprising PbTe, and a collector comprising Pt on an Al substrate.

The test was performed with an emitter temperature of 31±0.5° C., and a temperature difference between the emitter and collector was 7.5±0.5° C. The resulting I-V curve 102 obtained by varying the load resistor is shown in FIG. 19.

The voltage spread was sufficient to resemble over-the-barrier current transport, unlike the I-V curve produced in Section 4(b). Efficiency estimations cannot be made because the Al substrate has a high thermal conductivity. However, the output of the present converter is higher than that produced in Section 4(b).

5. Refrigeration Embodiments

Figure 20:
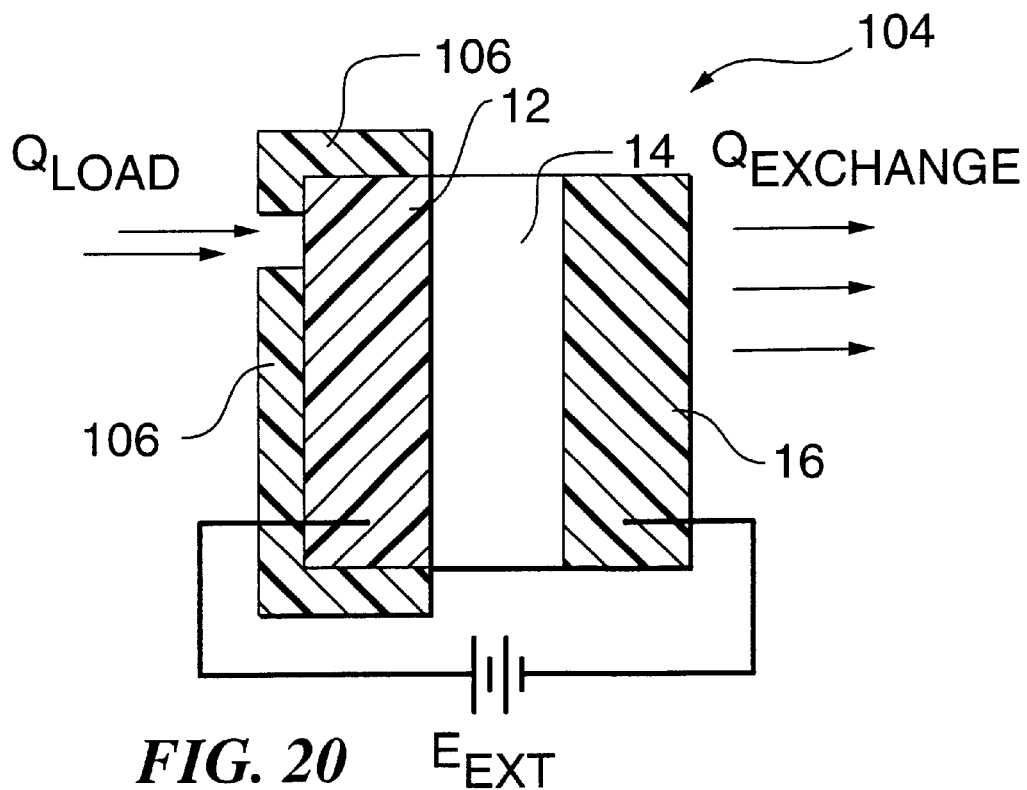
FIG. 20 shows a cross-sectional view of a thermionic converter for providing refrigeration.

The main components of a thermionic converter 104 for providing refrigeration (see FIG. 20) are essentially the same as those of a thermionic converter 10 for converting heat to electricity, as set forth above. The essential difference is that carrier transport is assisted by an external electric field, E$_{Ext}$, and the emitter 12 is connected to a thermal load. The emitter 12 is thermally insulated by means of an insulating material 106. Rather than a heated emitter 12, as is the case in the heat to electricity embodiment, a thermal load is cooled by heat flow, Q$_{Load}$, to the emitter 12 in the thermionic converter 104 illustrated in FIG. 20. The back surface of the collector 16 acts as a heat exchanger, and heat flow Q$_{Exchange}$ dissipates the heat from hot electrons. One skilled in the art of heat exchangers recognizes there are many means for accomplishing heat exchange including, but not limited to, air and liquid cooling, or equivalents thereof.

Barrier configurations that provide for a large thermal separation between the emitter 12 and collector 16 are set forth above.

It is important to note that phonon-assisted electron transport is less important in the refrigeration embodiment than in the heat-to-electricity embodiments, because the refrigeration mode depends primarily on the operating voltage. For example, there cannot be more than a 0.3 eV gain from phonons at significant currents. The operating voltage can be obtained from an external voltage source, E$_{ext}$.

Figure 21:
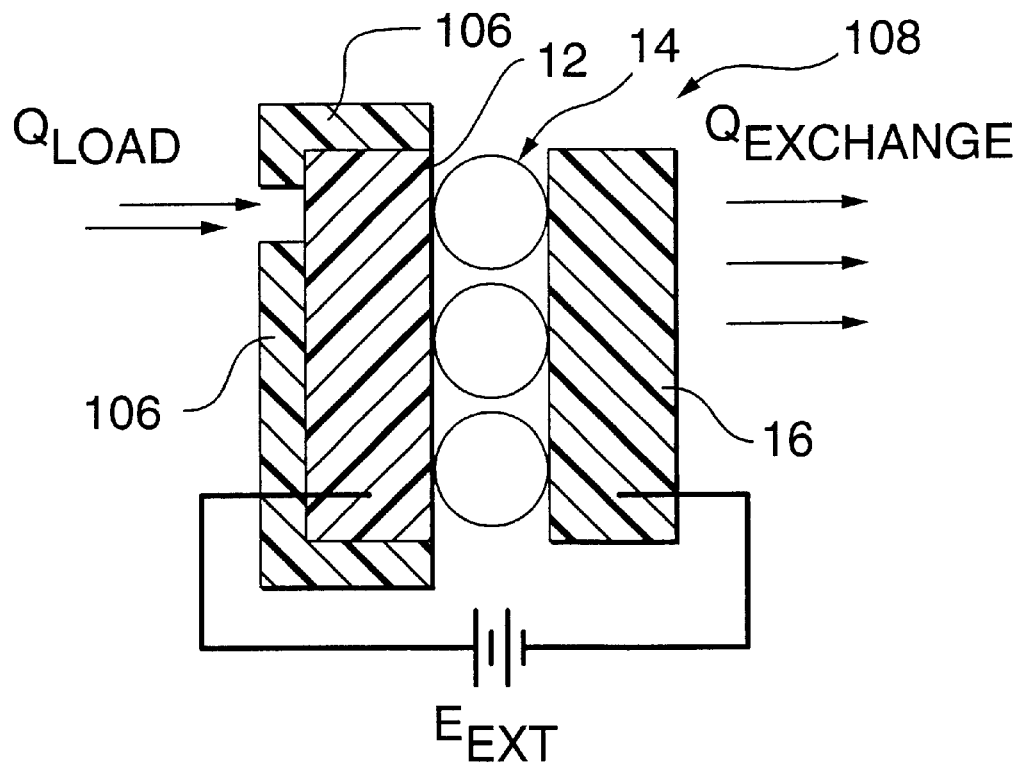
FIG. 21 shows a cross-sectional view of a barrier in the form of point contacts (microspheres) in a refrigeration embodiment.

FIG. 21 illustrates a thermionic converter 108 for providing refrigeration, which utilizes a barrier 14 in the form of point contacts. The barrier 14 may comprise, for example, spherical semiconductor particles similar to the embodiment illustrated in FIG. 1.

Figure 22:
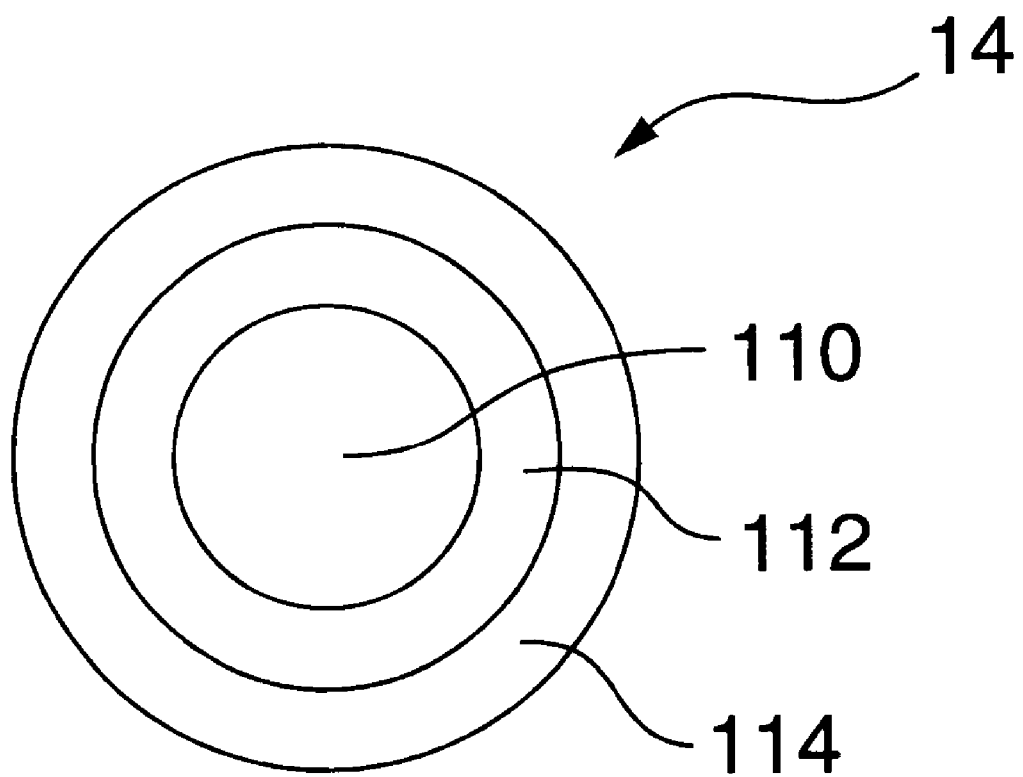
FIG. 22 shows cross-sectional view of a barrier in the form of microspheres comprising a non-thermally conductive core material having an outer metallic layer and a semiconductor layer.

The barrier 14 illustrated in FIG. 22 comprises particles having a thin semiconductor layer 114 that allows ballistic carrier transport, a conductive or doped layer 112 for electrical conductivity and electron work function matching, and a core material 110 (see FIG. 22). The core material 110 may be a dielectric, conductive or doped material, semiconductor, or plastic, if it is sufficiently hard and has suitable operating temperatures and thermal expansion coefficients. In this embodiment, one side of the particle will function as an emitter and the other side as a collector. It is also important to note that the conductive or doped layer 112 must have an electron work function value between that of the emitter 12 and collector 16.

6. Applications

Since energy conversion is the basis of modern civilization, an efficient energy converter has numerous applications, such as existing utility power plants, solar power plants, residential electricity supplies, residential/solar electricity supply, automotive, maritime, solar/maritime, portable electronics, environmental heat pump, refrigeration (cooling, air conditioning, etc.), aerospace, and so forth.

Power plants have a tremendous amount of waste heat with a potential of 300° C. and lower. Converting the waste heat at 20–40% of Carnot efficiency will give an additional 10–20% overall plant efficiency with equivalent savings on fuel.

The proliferation of low-cost converters will lower the capital costs of solar concentrator power plants with a higher efficiency than current steam/electricity cycles. Lower operating temperatures will also lower maintenance costs.

Residential electric supplies based on direct heat to electrical energy conversion is ideal for remote areas, where it is difficult or inconvenient to install power lines. The heat source may either be in the form of fossil fuel or solar concentrators. Solar concentrators can also be in the form of solar heated water pools, utilizing day/night temperature differences. A few hundred cubic meters of water with a hundred square meters of surface and cover could provide the electricity supply for a house in areas with a temperature differential of about 10° C.

A thermionic converter in combination with a conventional engine driving an electric generator and an electric motor would substantially increase mileage.

Direct energy conversion has tremendous application in electric cars. One application involves using thermionic devices with operating temperatures up to about 150 to 200° C. as overall efficiency boosters. Another application is an automobile with an electric drive and a conventional engine coupled with an electric generator having a converter array as an intermediate radiator.

Automotive and propulsion applications are also applicable to maritime applications. In addition, solar concentrators may be used in a sail-type fashion. A combination of light and inexpensive plastic Fresnel lenses with thermionic converters may be incorporated into modem rigid wing-type sails, providing for the use of wind and sun energy to propel a boat with about 100–200 W/m² of the sail solar component.

Since the converter can utilize very small temperature gradients in a self-sustaining mode, a temperature gradient between the heat sinks will be created with asymmetric heat exchange on the surface (e.g. one heat sink can be thermally insulated). Also, the system will run until something malfunctions, cooling the environment and producing electricity.

In summary, the method and apparatus disclosed herein is a significant improvement from the present state of the art of thermionic energy conversion.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by Letters Patent is:

1. A solid-state thermionic converter for converting heat to electricity comprising:

an electrically and thermally conductive electron emitter;

an electrically and thermally conductive electron collector for receiving electrons from the emitter;

an electrically conductive barrier disposed between said emitter and collector for filtering high energy electrons transferred from the emitter to the collector;

one or more electrically and thermally conductive fractional surface contacts integral to said emitter, barrier, or collector and disposed between and in intimate contact with the emitter and barrier, or the barrier and collector, or a combination thereof; and a thermally and electrically nonconductive space adjacent to the fractional surface contacts and the emitter and barrier, or the barrier and collector, or a combination thereof.

2. An apparatus according to claim 1, wherein said emitter comprises a metal or alloy.

3. An apparatus according to claim 1, wherein said emitter comprises a semiconductor material or doped semiconductor material.

4. An apparatus according to claim 1, wherein said emitter comprises an electrically and thermally conductive layer on a substrate.

5. An apparatus according to claim 1, wherein said emitter comprises a material having a high phonon energy spectra.

6. An apparatus according to claim 5, wherein said material comprises at least one of $TiH_x$, $VH_x$, $ZrH_x$, $NbH_x$, $TaH_x$, $ScH_x$, $YH_x$, $ThH_x$, $UH_x$, all rare earth hydrides, and combinations thereof.

7. An apparatus according to claim 1, wherein said emitter comprises a substrate of at least one of BH, $B_4C$, BN (hexagonal), BN (cubic), diamond, and combinations thereof, with a conductive or doped layer disposed between the substrate and the barrier.

8. An apparatus according to claim 7, wherein said conductive or doped layer has a thickness less than the electron mean free path in said conductive or doped layer.

9. An apparatus according to claim 1, wherein said collector comprises a metal or alloy.

10. An apparatus according to claim 1, wherein said collector comprises a semiconductor or doped semiconductor material.

11. An apparatus according to claim 1, wherein said collector comprises a electrically and thermally conductive layer on a substrate.

12. An apparatus according to claim 1, further comprising a barrier matching material disposed between the barrier and the collector to prevent leak back of electrons.

13. An apparatus according to claim 1, wherein said barrier comprises at least one of Si, n-type Ge, p-type Ge, n-type GaAs, n-type InAs, n-type GaSb, n-type InSb, Sb, n-type PbS, n-type PbSe, p-type $Cu_2O$, p-type Se, n-type CdS, $DySi_2$, $IrSi_3$, $Hg_{1-x}Cd_x$, Te, where x is in the range from about 0 to about 0.3, p-type Ge, amorphous B, $LaB_6$, $YbB_6$, $Pd_2Si$, n-type PbTe, p-type GaAs, n-type InP, and combinations thereof.

14. An apparatus according to claim 1, wherein said barrier comprises a resonant tunneling barrier.

15. An apparatus according to claim 14, wherein said resonant tunneling barrier comprises two or more barriers with a spacing between the barriers that provides for electrons to form a standing wave.

16. An apparatus according to claim 1, wherein said barrier comprises a moveable barrier.

17. An apparatus according to claim 16, wherein said moveable barrier comprises microspheres.

18. An apparatus according to claim 17, wherein said microspheres are about 3–500 nanometers in diameter.

19. An apparatus according to claim 16, wherein said moveable barrier comprises microwires.

20. An apparatus according to claim 16, wherein said moveable barrier comprises fixed pillars.

21. An apparatus according to claim 1, wherein said barrier comprises a dielectric material.

22. An apparatus according to claim 21, wherein said dielectric material comprises amorphous $Al_2O_3$ or $SiO_2$.

23. An apparatus according to claim 1, wherein said barrier comprises a first conductive or doped layer, an n-type semiconductor layer, a p-type semiconductor layer, and a second conductive or doped layer.

24. An apparatus according to claim 1, wherein said barrier comprises a first conductive or doped layer, an n-type semiconductor layer, and a second conductive or doped layer.

25. An apparatus according to claim 1, wherein said barrier comprises a first conductive or doped layer, a p-type semiconductor layer, and a second conductive or doped layer.

26. An apparatus according to claim 1, wherein said one or more fractional surface contacts are in the shape of point contacts.

27. An apparatus according to claim 1, wherein said one or more fractional surface contacts comprise at least one of parabolic-shaped contacts, elliptical-shaped contacts, curved-shaped contacts, and a combinations thereof.

28. An apparatus according to claim 1, wherein said one or more fractional surface contacts comprise at least one of nanotubes, particles, dendrites, and combinations thereof.

29. An apparatus according to claim 1, wherein said nonconductive space comprises a vacuum or nonconductive gas.

30. A solid-state thermionic converter for converting heat to electricity comprising:
   an electrically and thermally conductive electron emitter;
   an electrically and thermally conductive electron collector for receiving electrons from the emitter;
   an electrically conductive barrier disposed between said emitter and collector for filtering high energy electrons transferred from the emitter to the collector;
   one or more electrically and thermally conductive fractional surface contacts integral to said barrier and intimate contact with the emitter, or the collector, or a combination thereof; and
   a thermally and electrically nonconductive space adjacent to the fractional surface contacts and the emitter and barrier, or the barrier and collector, or a combination thereof.

31. A solid-state thermionic converter for converting beat to electricity comprising:
   an electrically and thermally conductive electron emitter;
   an electrically and thermally conductive electron collector for receiving electrons from the emitter;
   an electrically conductive barrier disposed between said emitter and collector for filtering high energy electrons transferred from the emitter to the collector;
   one or more electrically and thermally conductive fractional surface contacts integral to said emitter and in intimate contact with the barrier; and
   a thermally and electrically nonconductive space adjacent to the fractional surface contacts and the barrier.

32. A solid-state thermionic converter for converting heat to electricity comprising:
   an electrically and thermally conductive electron emitter;
   an electrical and thermally conductive electron collector for receiving electrons from the emitter;
   an electrically conductive barrier disposed between said emitter and collector for filtering high energy electrons transferred from the emitter to the collector;
   one or more electrically and thermally conductive fractional surface contacts integral to said collector and in intimate contact with the barrier; and
   a thermally and electrically nonconductive space adjacent to the fractional surface contacts and the barriers.

33. A solid-state thermionic converter for providing cooling comprising:
   an electrically and thermally conductive electron emitter connected to a thermal load;
   an electrically and thermally conductive electron collector for receiving electrons from the emitter, said collector having a back surface acting as a heat exchanger;
   an electrically conductive barrier disposed between said emitter and collector for filtering high energy electrons transferred from the emitter to the collector;
   one or more electrically and thermally conductive fractional surface contacts integral to said emitter, barrier, or collector and disposed between and in intimate contact with the emitter and barrier, or the barrier and collector, or a combination thereof; and
   a thermally and electrically nonconductive space adjacent to the fractional surface contacts and the emitter and barrier, or the barrier and collector, or a combination thereof.

34. An apparatus according to claim 33, wherein said emitter comprises a metal or alloy.

35. An apparatus according to claim 33, wherein said emitter comprises a semiconductor material or doped semiconductor material.

36. An apparatus according to claim 33, wherein said emitter comprises an electrically and thermally conductive layer on a substrate.

37. An apparatus according to claim 33, wherein said emitter comprises a material having a high phonon energy spectra.

38. An apparatus according to claim 37, wherein said material comprises at least one of $TiH_x$, $VH_x$, $ZrH_x$, $NbH_x$, $TaH_x$, $ScH_x$, $YH_x$, $ThH_x$, $UH_x$, all rare earth hydrides, and combinations thereof.

39. An apparatus according to claim 33, wherein said emitter comprises a substrate of at least one of BH, $B_4C$, BN (hexagonal), BN (cubic), diamond, aid combinations thereof, with a conductive or doped layer disposed between the substrate and the barrier.

40. An apparatus according to claim 39, wherein said conductive or doped layer has a thickness less than the electron mean free path in said conductive or doped layer.

41. An apparatus according to claim 33, wherein said collector comprises a metal or alloy.

42. An apparatus according to claim 33, wherein said collector comprises a semiconductor or doped semiconductor material.

43. An apparatus according to claim 33, wherein said collector comprises a electrically and thermally conductive layer on a substrate.

44. An apparatus according to claim 33, further comprising a barrier matching material disposed between the barrier and the collector to prevent leak back of electrons.

45. An apparatus according to claim 33, wherein said barrier comprises at least one of Si, n-type Ge, p-type Gc, n-type GaAs, n-type InAs, n-type GaSb, n-type InSb, Sb, n-type PbS, n-type PbSc, p-type $Cu_2O$, p-type Se, n-type CdS, $DySi_2$, $IrSi_3$, $Hg_{1-x}Cd_x$, Te, where x is in the range from about 0 to about 0.3, p-type Ge, amorphous B, $LaB_6$, $YbB_6$, $Pd_2Si$, n-type PbTe, p-type GaAs, n-type InP, and combinations thereof.

46. An apparatus according to claim 33, wherein said barrier comprises a resonant tunneling barrier.

47. An apparatus according to claim 46, wherein said resonant tunneling barrier comprises two or more barriers with a spacing between the barriers that provides for electrons to from a standing wave.

48. An apparatus according to claim 33, wherein said barrier comprises a moveable barrier.

49. An apparatus according to claim 48, wherein said moveable barrier comprises microspheres.

50. An apparatus according to claim 49, wherein said micro spheres are about 3–500 nanometers in diameter.

51. An apparatus according to claim 48, wherein said moveable barrier comprises microwires.

52. An apparatus according to claim 48, wherein said moveable barrier comprises fixed pillars.

53. An apparatus according to claim 33, wherein said barrier comprises a dielectric material.

54. An apparatus according to claim 53, wherein said dielectric material comprises amorphous $Al_2O_3$ or $SiO_2$.

55. An apparatus according to claim 33, wherein said barrier comprises a first conductive or doped layer, an n-type semiconductor layer, a p-type semiconductor layer, and a second conductive or doped layer.

56. An apparatus according to claim 33, wherein said barrier comprises a first conductive or doped layer, an n-type semiconductor layer, and a second conductive or doped layer.

57. An apparatus according to claim 33, wherein said barrier comprises a first conductive or doped layer, a p-type semiconductor layer, and a second conductive or doped layer.

58. An apparatus according to claim 33, wherein said one or more fractional surface contacts are in the shape of point contacts.

59. An apparatus according to claim 33, wherein said one or more fractional surface contacts comprise at least one of parabolic-shaped contacts, elliptical-shaped contacts, curved-shaped contacts, and combinations thereof.

60. An apparatus according to claim 33, wherein said one or more fractional surface contacts comprise at least one of nanotubes, particles, dendrites, and combinations thereof.

61. An apparatus according to claim 33, wherein said nonconductive space comprises a vacuum or nonconductive gas.

62. A solid-state thermionic converter for providing cooling comprising:

an electrically and thermally conductive electron emitter;

an electrically and thermally conductive electron collector for receiving electrons from the emitter, said collector having a back surface acting as a heat exchanger;

an electrically conductive barrier disposed between said emitter and collector for filtering high energy electrons transferred from the emitter to the collector;

one or more electrically and thermally conductive fractional surface contacts integral to said barrier and disposed between and in intimate contact with the emitter and barrier, or the barrier and collector, or a combination thereof; and a thermally and electrically nonconductive space adjacent to the fractional surface contacts and the emitter end barrier, or the barrier and collector, or a combination thereof.

63. A solid-state thermionic converter for providing cooling comprising:

an electrically and thermally conductive electron emitter;

an electrically and thermally conductive electron collector for receiving electrons from the emitter, said collector having a back surface acting as a heat exchanger;

an electrically conductive barrier disposed between said emitter and collector for filtering high energy electrons transferred from the emitter to the collector;

one or more electrically and thermally conductive fractional surface contacts integral to said emitter and in intimate contact with the barrier; and a thermally and electrically nonconductive space adjacent to the fractional surface contacts and the barrier.

64. A solid-state thermionic converter for providing cooling comprising:

an electrically and thermally conductive electron emitter;

an electrically and thermally conductive electron collector for receiving electrons from the emitter, said collector having a back surface acting as a heat exchanger;

an electrically conductive barrier disposed between said emitter and collector for filtering high energy electrons transferred from the emitter to the collector;

one or more electrically and thermally conductive fractional surface contacts integral to said collector and in intimate contact with the barrier; and a thermally and electrically nonconductive space adjacent to the fractional surface contacts and the barrier.

\* \* \* \* \*

UNITED STATES PATENT AND TRADEMARK OFFICE
CERTIFICATE OF CORRECTION

PATENT NO. : 6,489,704 B1
DATED : December 3, 2002
INVENTOR(S) : Kucherov et al.

It is certified that error appears in the above-identified patent and that said Letters Patent is hereby corrected as shown below:

Title page,
Item [56], References Cited, U.S. PATENT DOCUMENTS, after "3,328,611 A" change "6/1967" to -- 6/1964 --
After "5,973,259 A" change "10/1999" to -- 12/1999 --
OTHER PUBLICATIONS, after "Journal of Applied Physics, vol 83, No. 9" change "(1 Ma 1998)" to -- (1 May 1998) --

Column 13,
Line 17, change "electrically conductive, barrier" to -- electrically conductive barrier, --
Line 56, after "used" change "was" to -- as --

Column 15,
Line 17, change "106" to -- $10^6$ --
Line 18, change "104" to -- $10^4$ --
Line 19, change "103" to -- $10^3$ --

Column 18,
Line 22, change "n-typc" to -- n-type --
Line 23, change "$Hg_{1-x}Cd_x$, Te, " to -- $Hg_{1-x}Cd_xTe$, --
Line 64, before "combinations" remove "a"

Column 19,
Line 14, before "intimate" insert -- in --
Line 21, change "beat" to -- heat --

Column 20,
Line 17, change "aid" to -- and --
Line 34, change "p-type Gc" to -- p-type Ge --
Line 36, change "n-type PbSc" to -- n-type PbSe --
Line 51, change "micro spheres" to -- microspheres --

Column 22,
Line 33, please add the following claims:
-- 65. An apparatus according to Claim 1, further comprising an electric load connected to said emitter and to said collector. --

UNITED STATES PATENT AND TRADEMARK OFFICE
CERTIFICATE OF CORRECTION

PATENT NO. : 6,489,704 B1
DATED : December 3, 2002
INVENTOR(S) : Kucherov et al.

It is certified that error appears in the above-identified patent and that said Letters Patent is hereby corrected as shown below:

<u>Column 22 (cont'd),</u>
-- 66. An apparatus according to Claim 30, further comprising an electric load connected to said emitter and to said collector. --

-- 67. An apparatus according to Claim 31, further comprising an electric load connected to said emitter and to said collector. --

-- 68. An apparatus according to Claim 32, further comprising an electric load connected to said emitter and to said collector. --

-- 69. An apparatus according to Claim 33, further comprising an electric load connected to said emitter and to said collector. --

-- 70. An apparatus according to claim 62, wherein said emitter is connected to a thermal load, and wherein an electrical potential is applied between said emitter and said collector. --

-- 71. An apparatus according to claim 63, wherein said emitter is connected to a thermal load, and wherein an electric potential is applied between said emitter and said collector. --

-- 72. An apparatus according to claim 64, wherein said emitter is connected to a thermal load, and wherein an electrical potential is applied between said emitter and said collector. --

Signed and Sealed this

Ninth Day of March, 2004

JON W. DUDAS
*Acting Director of the United States Patent and Trademark Office*